United States Patent
Zhang

(10) Patent No.: US 12,471,434 B2
(45) Date of Patent: Nov. 11, 2025

(54) LIGHT-EMITTING SUBSTRATE AND METHOD FOR MANUFACTURING THE SAME, AND LIGHT-EMITTING APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Aidi Zhang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 711 days.

(21) Appl. No.: 17/792,201

(22) PCT Filed: May 14, 2021

(86) PCT No.: PCT/CN2021/093924
§ 371 (c)(1),
(2) Date: Jul. 12, 2022

(87) PCT Pub. No.: WO2021/254057
PCT Pub. Date: Dec. 23, 2021

(65) Prior Publication Data
US 2023/0055663 A1    Feb. 23, 2023

(30) Foreign Application Priority Data

Jun. 16, 2020   (CN) .......................... 202010550002.3

(51) Int. Cl.
*H10K 50/115*   (2023.01)
*H10K 50/16*    (2023.01)
(Continued)

(52) U.S. Cl.
CPC ........... *H10K 50/115* (2023.02); *H10K 50/16* (2023.02); *H10K 59/122* (2023.02); *H10K 85/40* (2023.02); *H10K 59/1201* (2023.02); *H10K 71/00* (2023.02)

(58) Field of Classification Search
CPC .................................................... H10K 50/115
(Continued)

(56) References Cited

U.S. PATENT DOCUMENTS

2005/0093432 A1    5/2005   Yamazaki et al.
2017/0269274 A1*   9/2017   Cheng ................. G02B 5/3033
(Continued)

FOREIGN PATENT DOCUMENTS

| CN | 110010782 A | 7/2019 |
| CN | 110635057 A | 12/2019 |

(Continued)

OTHER PUBLICATIONS

First Office Action for Application No. 202010550002.3 issued by the Chinese Patent Office on May 20, 2022.
(Continued)

*Primary Examiner* — Ajay Arora
(74) *Attorney, Agent, or Firm* — XSENSUS LLP

(57) ABSTRACT

A light-emitting substrate includes a substrate, a pixel defining layer arranged on the substrate, a plurality of light-emitting devices and at least one blocking unit. The pixel defining layer has a plurality of openings, and each light-emitting device includes a quantum dot light-emitting pattern arranged in an opening. Each opening has at least one side wall, a side wall includes a first portion and a second portion, the first portion is a portion of the side wall that is in contact with a respective quantum dot light-emitting pattern, and the second portion is a portion of the side wall that is away from the substrate relative to the first portion.
(Continued)

Each blocking unit includes at least one siloxane segment. Each blocking unit is located in an opening, and at least one siloxane segment in each blocking unit is grafted to a second portion of a corresponding side wall.

20 Claims, 17 Drawing Sheets

(51) Int. Cl.
*H10K 59/122* (2023.01)
*H10K 85/40* (2023.01)
*H10K 59/12* (2023.01)
*H10K 71/00* (2023.01)

(58) Field of Classification Search
USPC .......................................................... 257/40
See application file for complete search history.

(56) References Cited

U.S. PATENT DOCUMENTS

2021/0098726 A1* 4/2021 Zhang .................. H10K 71/811
2022/0098051 A1 3/2022 Zhang et al.

FOREIGN PATENT DOCUMENTS

CN 112186118 A 1/2021
CN 110010782 B * 10/2021 ............. H10K 50/11

OTHER PUBLICATIONS

Wang et al., Direct optical lithography of functional inorganic nanomaterials, Science 357(6349), Jul. 28, 2017, pp. 385-388.

* cited by examiner

LIGHT-EMITTING SUBSTRATE AND METHOD FOR MANUFACTURING THE SAME, AND LIGHT-EMITTING APPARATUS

CROSS-REFERENCE TO RELATED APPLICATIONS

This application is a national phase entry under 35 USC 371 of International Patent Application No. PCT/CN2021/093924, filed on May 14, 2021, which claims priority to Chinese Patent Application No. 202010550002.3, filed on Jun. 16, 2020, which are incorporated herein by reference in their entirety.

TECHNICAL FIELD

The present disclosure relates to the field of lighting and display technologies, and in particular, to a light-emitting substrate and a method for manufacturing the same, and a light-emitting apparatus.

BACKGROUND

Compared with organic light-emitting diode (OLED) devices, quantum dot light-emitting diode (QLED) devices have advantages of high theoretical luminous efficiency, adjustable color, wider color gamut, good color saturation and vividness, and lower energy costs, etc.

SUMMARY

In an aspect, a light-emitting substrate is provided. The light-emitting substrate includes: a substrate, a pixel defining layer disposed on the substrate, and a plurality of light-emitting devices. The pixel defining layer has a plurality of openings, and each light-emitting device includes a quantum dot light-emitting pattern disposed in an opening. Each opening has at least one side wall, and a side wall includes a first portion and a second portion. The first portion is a portion of the side wall that is in contact with a respective quantum dot light-emitting pattern, and the second portion is a portion of the side wall that is away from the substrate relative to the first portion. The light-emitting substrate further includes at least one blocking unit. Each blocking unit includes at least one siloxane segment. Each blocking unit is located in an opening, and the at least one siloxane segment in each blocking unit is grafted to a second portion of a corresponding side wall.

In some embodiments, the at least one siloxane segment in each blocking unit is bonded to an oxygen atom in the second portion of the corresponding side wall.

In some embodiments, each siloxane segment includes at least one silicon-oxygen bond. Each siloxane segment includes a first sub-segment bonded to the oxygen atom in the second portion of the corresponding side wall, and at least one second sub-segment. Each second sub-segment is bonded to a silicon atom in the first sub-segment. A number of silicon-oxygen bonds in the first sub-segment is in a range from 1 to 25, inclusive, and a total number of silicon-oxygen bonds in a second sub-segment bonded to a same silicon atom in the first sub-segment is in a range from 0 to 24, inclusive.

In some embodiments, each blocking unit includes at least two siloxane segments. The at least two siloxane segments are cross-linked with each other to form at least one third sub-segment, and a number of silicon-oxygen bonds in each third sub-segment is in a range from 2 to 25, inclusive.

In some embodiments, a material of the pixel defining layer includes a hydroxyl-containing polymer material or a silicon-containing inorganic oxide material.

In some embodiments, the hydroxyl-containing polymer material includes one or more of polyethylene glycol, polyvinyl acetate, cellulose and chitosan.

In some embodiments, each blocking unit further includes at least one coordinating group each grafted to one or more siloxane segments, and each coordinating group is bonded to at least one quantum dot in a corresponding quantum dot light-emitting pattern.

In some embodiments, each coordinating group includes one of a sulfur-containing group, a nitrogen-containing group, and an oxygen-containing group.

In some embodiments, the at least siloxane segment in each blocking unit further includes a capping group. A coordinating group is formed on the capping group.

In some embodiments, the capping group is a silane group.

In some embodiments, coordination atoms of the at least one coordinating group in each blocking unit account for 3.5% to 12.7% of the blocking unit by mass.

In some embodiments, the plurality of light-emitting devices include a plurality of types of light-emitting devices emitting different colors of light; and second portions of side walls corresponding to each kind of light-emitting devices are each grafted with the at least one siloxane segment.

In some embodiments, each light emitting device further includes: a first electrode located on a side of the quantum dot light-emitting pattern facing the substrate and configured to provide one of electrons and holes for the quantum dot light-emitting pattern; and a second electrode located on a side of the quantum dot light-emitting pattern facing away from the substrate and configured to provide another of the electrons and the holes for the quantum dot light-emitting pattern.

In some embodiments, the light-emitting device further includes an electron transport layer disposed between the quantum dot light-emitting pattern and an electrode, for providing the electrons, of the first electrode and the second electrode. A material of the electron transport layer is an inorganic material.

In another aspect, a method for manufacturing a light-emitting substrate is provided. The method includes:
  forming a pixel defining layer on a substrate, the pixel defining layer having a plurality of openings; and
  forming a plurality of light-emitting devices and at least one blocking unit on the substrate, each light-emitting device including a quantum dot light-emitting pattern formed in an opening, each blocking unit including at least one siloxane segment.

Each opening has at least one side wall, and a side wall includes a first portion and a second portion. The first portion is a portion of the side wall that is in contact with a respective quantum dot light-emitting pattern, and the second portion is a portion of the side wall that is away from the substrate relative to the first portion. Each blocking unit is located in an opening, and the at least one siloxane segment in each blocking unit is grafted to a second portion of a corresponding side wall.

In some embodiments, forming the plurality of light emitting devices and the at least one blocking unit on the substrate includes:
  dividing the plurality of openings into n opening groups, each opening group including at least one opening, and n being a positive integer greater than or equal to 2;
  forming a mask on the substrate on which the pixel defining layer has been formed, the mask exposing all openings in an i-th opening group and covering at least remaining openings in the plurality of openings except for the i-th opening group, and i being a value in a range from 1 to n, inclusive; forming a quantum dot light-emitting layer on the substrate on which the mask has been formed, the quantum dot light-emitting layer including the quantum dot light-emitting pattern located in each opening of the i-th opening group and a reserved pattern covering the mask; grafting the at least one siloxane segment to the second portion of each side wall in the i-th opening group, each siloxane segment of the at least one siloxane segment including at least one silicon-oxygen bond; and dissolving the mask to remove the formed reserved pattern together.

In some embodiments, the mask includes a photoresist sub-mask. Dissolving the mask includes: using a developer solution to dissolve the mask.

In some embodiments, the mask includes a first sub-mask and a second sub-mask that are stacked, the first sub-mask being closer to the substrate than the second sub-mask. The first sub-mask is a polymer sub-mask soluble in an alcohol solvent, and the second sub-mask is a photoresist sub-mask. Dissolving the mask includes: using the alcohol solvent to dissolve the mask.

In some embodiments, a material of the pixel defining layer includes a hydroxyl-containing polymer material or a silicon-containing inorganic oxide material. Grafting the at least one siloxane segment to the second portion of each side wall in the i-th opening group includes: in a case where the material of the pixel defining layer includes the hydroxyl-containing polymer material, hydrolyzing first reactants with hydroxyl groups in the second portion of each side wall in the i-th opening group; in a case where the material of the pixel defining layer includes the silicon-containing inorganic oxide material, hydrolyzing first reactants with oxygen atoms in the second portion of each side wall in the i-th opening group. A general structural formula of a first reactant is shown in a following formula (1):

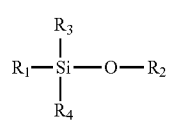

(1)

Where $R_1$ is any one of an alkoxy group, an acyloxy group, and a ketoxime group; $R_2$ is any one of a hydrogen atom, an alkyl group, an alkenyl group, and an aryl group; and $R_3$ and $R_4$ are each any one of a hydrogen atom, an alkoxy group, a hydroxy group, an acyloxy group, a ketoxime group, an alkyl group, an alkenyl group, and an aryl group.

In some embodiments, hydrolyzing the first reactants with the hydroxyl groups or oxygen atoms in the second portion of each side wall in the i-th opening group, includes: bringing the first reactants into contact with the second portion of each side wall in the i-th opening group in a pH range of 8~11, so that the first reactants and the hydroxyl groups or the oxygen atoms in the second portion of each side wall in the i-th opening group undergo a hydrolysis reaction.

In some embodiments, the first reactant further includes a coordinating group.

Before the hydrolysis reaction between the first reactants and the hydroxyl groups or the oxygen atoms in the second portion of each side wall in the i-th opening group, the method further includes: protecting the coordinating group with a protecting group; and removing the protecting group after the grafting is completed.

Alternatively, the method further includes: reacting second reactants each having a coordinating group with the at least one siloxane segment in each blocking unit, so as to form at least one coordinating group in the blocking unit.

In some embodiments, the first reactant includes any one or more of tetramethyl orthosilicate, tetraethyl orthosilicate, diphenyldimethoxysilane, hexadecyltrimethoxysilane, isobutyltriethoxysilane, isobutyltrimethoxysilane, dimethyldimethoxysilane, methyltris(methylethylketoximino)silane, methyltriacetoxysilane, 3-isocyanatopropyltriethoxysilane, phenyltrimethoxysilane, phenyltriethoxysilane, (octyl)-trimethoxysilane, n-octyltriethoxysilane, dodecyltriethoxysilane, dodecyltrimethoxysilane and vinyltris(methylethylketoximino)silane.

In some embodiments, a general structural formula of a second reactant is shown in a following formula (2):

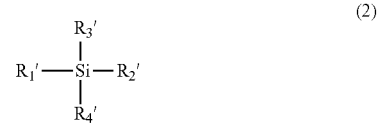

(2)

Where $R_1'$ is any one of an alkoxy group, an acyloxy group and a ketoxime group; $R_2'$ is any one of first hydrocarbyl groups of aliphatics, aromatics or a mixture of aliphatics and aromatics that are branched or unbranched and saturated or unsaturated, a first hydrocarbyl group has the coordinating group; and $R_3'$ and $R_4'$ are each any one of a hydrogen atom, a hydroxyl group, an alkoxy group, an acyloxy group, a ketoxime group, and second hydrocarbyl groups of aliphatics, aromatics or a mixture of aliphatics and aromatics that are branched or unbranched and saturated or unsaturated, a second hydrocarbyl group has the coordinating group or has no coordinating group.

In some embodiments, the second reactant includes any one or more of (3-Mercaptopropyl)trimethoxysilane, (3-Mercaptopropyl)triethoxysilane, (3-Mercaptopropyl) methyldimethoxysilane, (3-Mercaptopropyl)methyldiethoxysilane, Mercaptopropylsilane, 3-Mercaptopropyltrimethylsilane, Bis-[3-(triethoxysilyl)propyl]-tetrasulfide, (3-Aminopropyl)trimethoxysilane, (3-Aminopropyl)triethoxysilane, (3-Aminopropyl)methyldiethoxysilane, N-(β-aminoethyl-γ-aminopropyl)trimethoxysilane, N-(β-aminoethyl-γ-aminopropyl)methyldimethoxysilane, Diethylenetriaminopropyltrimethoxysilane, 3-Ureidopropyltrimethoxysilane, n-Butylaminopropyltrimethoxysilane, N-(2-aminoethyl)-3-aminopropyltrimethoxysilane, N-[3-(Trimethoxysilyl)propyl]ethylenediamine, 3-(Phenylamino)propyltrimethoxysilane, N-phenyl-3-aminopropyltrimethoxysilane, [3-(2-Aminoethyl)aminopropyl]trimethoxysilane, N-(n-Butyl)-3-aminopropyltrimethoxysilane, and N-(β-aminoethyl-γ-aminopropyl)trimethoxysilane.

In yet another aspect, a light-emitting apparatus is provided. The light-emitting apparatus includes a light-emitting substrate, and the light-emitting substrate is the light-emitting substrate as described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
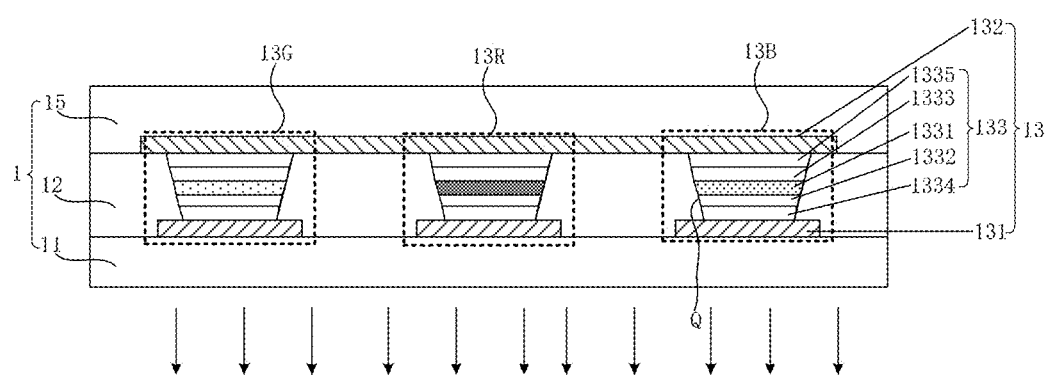
FIG. 1 is a sectional view of a light-emitting substrate, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

In addition, the phase "based on" as used herein is meant to be open and inclusive, since a process, step, calculation or other action that is "based on" one or more of the stated conditions or values may, in practice, be based on additional conditions or values other than those stated.

As used herein, the terms such as "about" or "approximately" include a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

Exemplary embodiments are described herein with reference to sectional views and/or plan views as idealized exemplary drawings. In the drawings, thickness of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Thus, the regions shown in the accompanying drawings are schematic in nature, and their shapes are not intended to show actual shapes of regions in a device, and are not intended to limit the scope of the exemplary embodiments.

Figure 2:
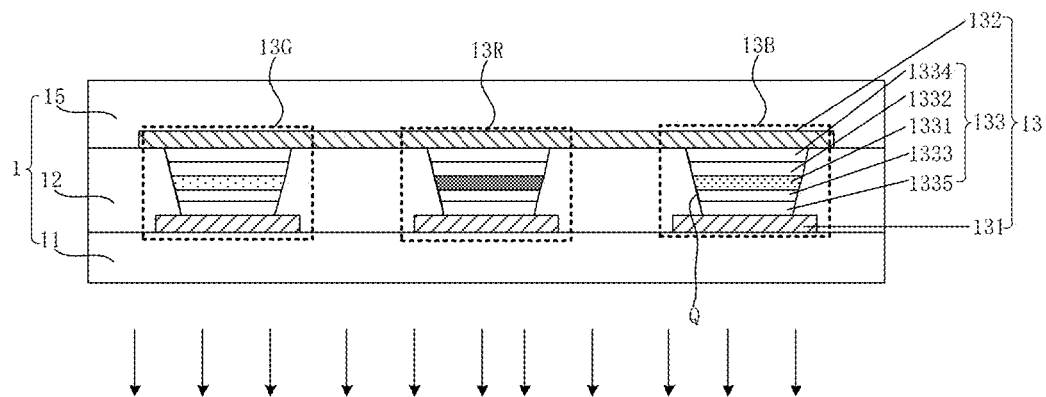
FIG. 2 is a sectional view of another light-emitting substrate, in accordance with some embodiments.

Some embodiments of the present disclosure provide a light-emitting apparatus based on quantum dot light-emitting materials. As shown in FIGS. 1 and 2, the light-emitting apparatus 100 includes a light-emitting substrate. Of course, it may further include other components, such as a circuit for providing electrical signals to the light-emitting substrate to drive the light-emitting substrate to emit light. The circuit may be referred to as a control circuit, which may include a circuit board electrically connected to the light-emitting substrate and/or an integrated circuit (IC) electrically connected to the light-emitting substrate.

In some embodiments, the light-emitting apparatus may be a lighting apparatus. In this case, the light-emitting apparatus is used as a light source to realize a lighting function. For example, the light-emitting apparatus is a backlight module in a liquid crystal display apparatus, a lamp for internal or external lighting, or various types of signal lamps.

In some other embodiments, the light-emitting apparatus may be a display apparatus. In this case, the light-emitting substrate is a display substrate used for realizing a function of displaying images (i.e., pictures). The light-emitting apparatus may include a display or a product including a display. The display may be a flat panel display (FPD), a micro display, etc. If classified according to whether a user can see the back of the display, the display may be a transparent display or an opaque display. If classified according to whether the display can be bent or curled, the display may be a flexible display or a common display (which may be referred to as a rigid display). For example, the product including the display may include a computer display, a television, a billboard, a laser printer with a display function, a telephone, a mobile phone, a personal digital assistant (PDA), a laptop computer, a digital camera, a portable camcorder, a viewfinder, a vehicle, a large-area wall, a theater screen, a stadium sign, etc.

Some embodiments of the present disclosure provide a light-emitting substrate. As shown in FIGS. 1 and 2, the light-emitting substrate 1 include a substrate 11, a pixel defining layer 12 disposed on the substrate 11, and a plurality of light-emitting devices 13 disposed on the substrate 11. The pixel defining layer 12 has a plurality of openings Q. Light-emitting devices 13 may be arranged to be in one-to-one correspondence with openings Q, the light-emitting devices 13 here may be all or some of the light-emitting devices 13 included in the light-emitting substrate 1, and the openings Q here may be all or some of the openings in the pixel defining layer 12.

Each light-emitting device 13 may include a first electrode 131, a second electrode 132, and a light-emitting functional layer 133 disposed between the first electrode 131 and the second electrode 132. The light-emitting functional layer 133 includes a quantum dot light-emitting pattern 1331.

In some embodiments, as shown in FIG. 1, the first electrode 131 may be an anode, and in this case, the second electrode 132 is a cathode. In some other embodiments, as shown in FIG. 2, the first electrode 131 may be a cathode, and in this case, the second electrode 132 is an anode.

For a QLED (Quantum Dot Light Emitting Diode) light-emitting device, the light-emitting principle of the light-emitting device 13 is as follows: through a circuit connecting the anode and the cathode therebetween, the anode is used to inject holes into the light-emitting functional layer 133, and the cathode is used to inject electrons into the light-emitting functional layer 133; the formed electrons and holes form excitons in the quantum dot light-emitting pattern 1331, and the excitons radiatively transition back to the ground state and emit photons.

As shown in FIGS. 1 and 2, in order to improve the efficiency of injecting electrons and holes into the quantum dot light-emitting pattern 1331, the light-emitting functional layer 133 may further includes at least one of a hole transport layer (HTL) 1332, an electron transport layer (ETL) 1333, a hole injection layer (HIL) 1334 or an electron injection layer (EIL) 1335. For example, the light-emitting functional layer 133 includes the hole transport layer 1332 disposed between the anode and the quantum dot light-emitting pattern 1331, and the electron transport layer 1333 disposed between the cathode and the quantum dot light-emitting pattern 1331. In order to further improve the efficiency of injecting electrons and holes into the quantum dot light-emitting pattern 1331, the light-emitting functional layer 133 may further includes the hole injection layer 1334 disposed between the anode and the hole transport layer 1332, and the electron injection layer 1335 disposed between the cathode and the electron transport layer 1333.

The light-emitting substrate 1 may further be provided with a driving circuit connected to each light-emitting device 13 thereon. The driving circuit may be connected to the control circuit, so as to drive each light-emitting device 13 to emit light according to the electrical signals input by the control circuit. The driving circuit may be an active driving circuit or a passive driving circuit.

The light-emitting substrate 1 may emit white light, monochromatic light (i.e., single-color light) or color-tunable light.

In a first example, the light-emitting substrate 1 emits white light. In a first case, light-emitting devices 13 (for example, all the light-emitting devices 13) included in the light-emitting substrate 1 all emit white light. In this case, a material of the quantum dot light-emitting pattern 1331 of each light-emitting device 13 may include a mixed material of red quantum dot light-emitting material, green quantum dot light-emitting material and blue quantum dot light-emitting material. In this case, emission of white light may be realized by driving each light-emitting device 13 to emit light. In a second case, as shown in FIGS. 1 and 2, the plurality of light emitting devices 13 include a red light-emitting device 13R, a green light-emitting device 13G, and a blue light-emitting device 13B. A material of the quantum dot light-emitting pattern 1331 of the light-emitting device 13R may include a red quantum dot light-emitting material, a material of the quantum dot light-emitting pattern 1331 of the light-emitting device 13G may include a green quantum dot light-emitting material, and a material of the quantum dot light-emitting pattern 1331 of the light-emitting device 13B may include a blue quantum dot light-emitting material. In this case, by controlling the brightness of light emitted by the light-emitting device 13R, the light-emitting device 13G, and the light-emitting device 13B, it may be possible to cause light mixing of the light-emitting device 13R, the light-emitting device 13G, and the light-emitting device 13B, so that the light-emitting substrate 1 presents white light.

In this example, the light-emitting substrate 1 may be used for lighting. That is, it may be used in the lighting apparatus.

In a second example, the light-emitting substrate 1 emits monochromatic light. In a first case, light-emitting devices 13 (for example, all the light-emitting devices 13) included in the light-emitting substrate 1 all emit monochromatic light (such as red light). In this case, the material of the quantum dot light-emitting pattern 1331 of each light-emitting device 13 includes a red quantum dot light-emitting material. In this case, emission of red light may be realized by driving each light emitting device 13 to emit light. In a second case, the light-emitting substrate 1 is similar in structure to the plurality of light-emitting devices described in the second case of the first example. In this case, emission of monochromatic light may be realized by individually driving the light-emitting device 13R, the light-emitting device 13G, or the light-emitting device 13B.

In this example, the light-emitting substrate 1 may be used for lighting. That is, the light-emitting substrate 1 may be used in the lighting apparatus. Alternatively, the light-emitting substrate 1 may be used to display a single-color image or picture. That is, the light-emitting substrate 1 may be used in the display apparatus.

In a third example, the light-emitting substrate 1 may emit color-tunable light (i.e., colored light). The light-emitting substrate 1 is similar in structure to the plurality of light-emitting devices described in the second case of the first example, and by controlling the brightness of each light-emitting device 13, it may be possible to control the color and brightness of the mixed light emitted by the light-emitting substrate 1, and thus realize emission of colored light.

In this example, the light-emitting substrate 1 may be used to display images or pictures. That is, the light-emitting substrate 1 may be used in the display apparatus. Of course, the light-emitting substrate 1 may also be used in the lighting apparatus.

Figure 3:
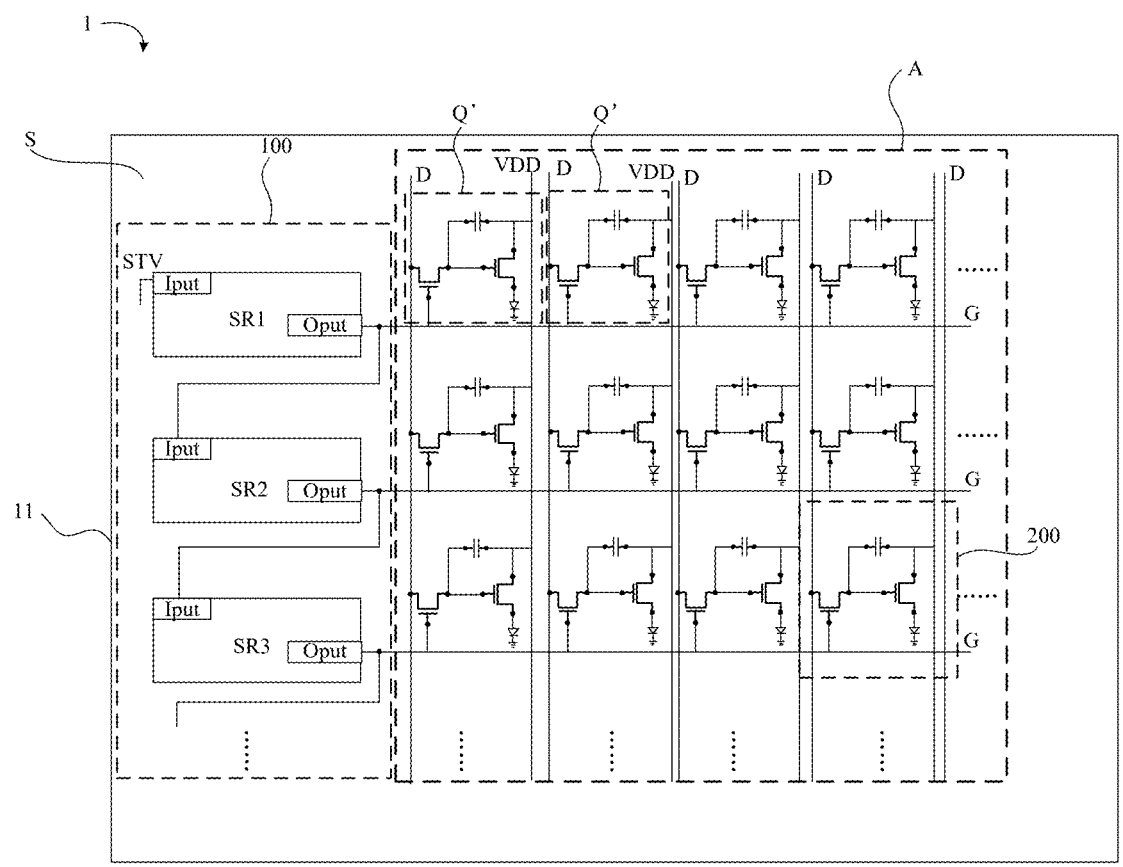
FIG. 3 is a top view of a light-emitting substrate, in accordance with some embodiments.

In the third example, considering an example where the light-emitting substrate 1 is a display substrate (e.g., a full-color display panel), as shown in FIG. 3, the light-emitting substrate 1 includes a display area A and a peripheral area S disposed around the display area A. The display area A includes a plurality of sub-pixel areas Q', each sub-pixel area Q' corresponds to a single opening Q, and a single opening Q corresponds to a light-emitting device 13.

Each sub-pixel region Q' is provided therein with a pixel driving circuit 200 for driving a corresponding light emitting device 13 to emit light The peripheral region S is used for wiring, for example, used for accommodating the gate driver circuit 100 connected to the pixel driving circuits 200.

In the process of manufacturing the light-emitting substrate 1, since the quantum dot light-emitting material is easily affected by heat and moisture, it is impossible to use the same evaporation deposition method as used in the manufacture of the organic light-emitting material in OLEDs (Organic Light-Emitting Diodes). In the process of forming the quantum dot light-emitting pattern 1331 in each opening Q, in the related art, the quantum dot light-emitting material is usually prepared into a solution, so as to form the quantum dot light-emitting pattern by a spin coating process or an inkjet printing process.

Figure 4:
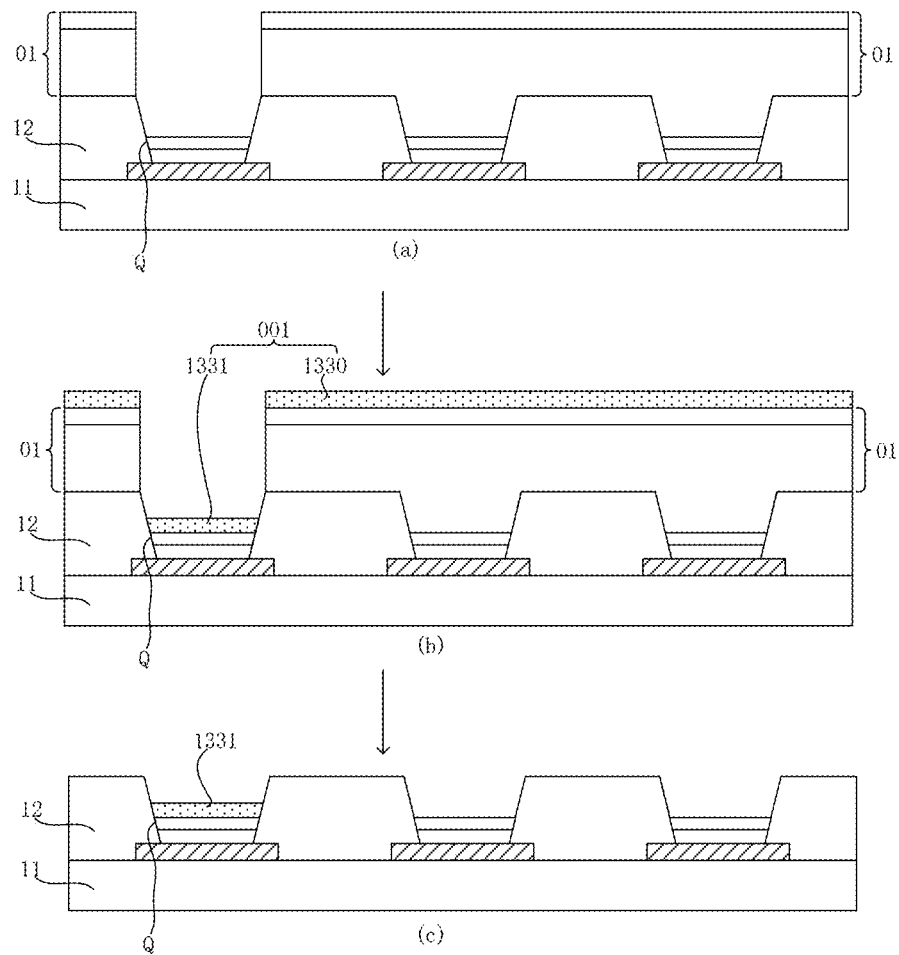
FIG. 4 is a flow diagram of a method for manufacturing a light-emitting substrate, in accordance with some embodiments.

However, in a case where the quantum dot light emitting pattern 1331 is fabricated by a spin coating process, as shown in part (a) of FIG. 4, in order to form the quantum dot light emitting pattern 1331 in at least one opening Q, a mask 01 is usually used to cover the area except for the opening Q before spin coating. Then, as shown in part (b) of FIG. 4, a quantum dot light-emitting layer 001 is formed by spin coating, and the quantum dot light-emitting layer 001 includes a quantum dot light-emitting pattern 1331 formed in the opening Q, and a reserved pattern 1330 formed on the mask 01. As shown in part (c) of FIG. 4, after the spin-coating, the mask 01 is removed by dissolution, so that the reserved pattern 1330 on the mask 01 is removed together, thereby realizing the patterning of the quantum dot light-emitting layer 001 and forming the quantum dot light-emitting pattern 1331 in each opening Q.

During this process, when the mask 01 is removed, part of the quantum dot light-emitting material of the quantum dot light-emitting pattern 1331 already formed in the opening Q will also be washed away, resulting in the loss of the quantum dot light-emitting material.

In addition, with the increase of the colors of light emitted by the light-emitting devices 13, the quantum dot light-emitting patterns 1331 that emit different colors of light need to be formed through a plurality of spin coating processes, and each time a kind of quantum dot light-emitting patterns 1331 are formed, the mask 01 on the light-emitting substrate 1 needs to be removed once. As a result, the earlier the quantum dot light-emitting pattern 1331 is formed, the more times the quantum dot light-emitting material therein is washed away. Consequently, the earlier the quantum dot light-emitting pattern 1331 is formed, the greater the loss of the quantum dot light-emitting material therein. Thus, the light-emitting performance of the light-emitting device 13 will be seriously affected.

Figure 5:
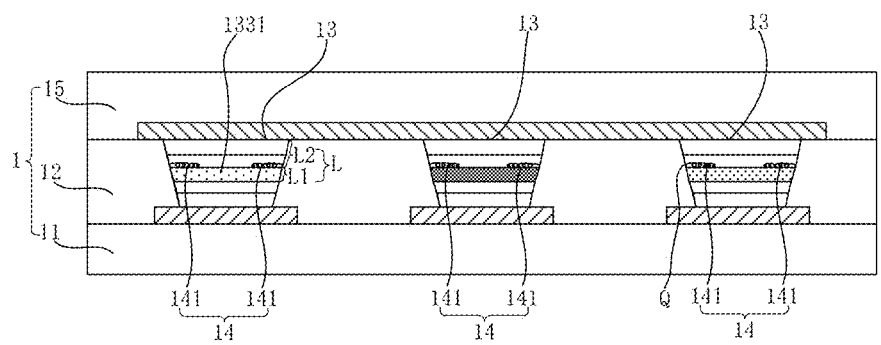
FIG. 5 is a sectional view of yet another light-emitting substrate, in accordance with some embodiments.
Figure 13:
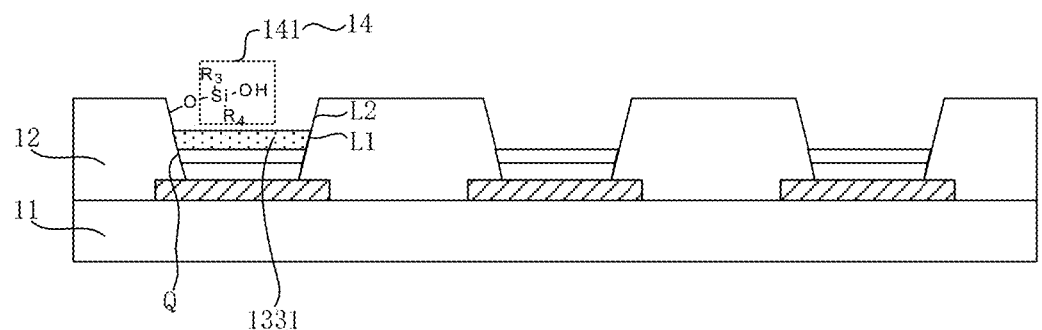
FIG. 13 is a sectional view of yet another light-emitting substrate, in accordance with some embodiments.

In light of this, in some embodiments, as shown in FIGS. 5 and 13, the light-emitting substrate 1 further includes at least one blocking unit 14, each blocking unit 14 includes at least one siloxane segment 141, and each siloxane segment 141 includes at least one silicon-oxygen bond. Each opening Q has side wall(s) L, a side wall L includes a first portion L1 and a second portion L2, the first portion L1 is a portion of the side wall L that is in contact with the quantum dot light-emitting pattern 1331, and the second portion L2 is the portion of the side wall L that is away from the substrate 11 relative to the first portion L1. Each blocking unit 14 is located in an opening Q, and the at least one siloxane segment 141 in each blocking unit 14 is grafted to the second portion L2 of a corresponding side wall L.

Siloxane, a polymer with a Si—O—Si bond as the main chain, can be a linear, cyclic or cross-linked network polymer. Its structural formula is as shown in the following formula (I). Where $R_1$, $R_3$ and $R_4$ are each any one of an alkyl group, an alkenyl group, an aryl group, a hydroxyl group and a hydrogen atom, $R_2$ is a hydrogen atom, and n is a positive integer greater than or equal to 2. The siloxane segment 141 refers to a partial segment of the siloxane. Therefore, the siloxane segment 141 has a stable structure and stable chemical properties similar to those of siloxane. For example, the siloxane segment 141 may be a segment composed of one or more silicon-oxygen bonds in the siloxane as shown in the following formula (I), and is grafted to the second portion L2 of the side wall L through a silicon atom.

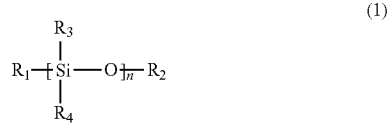

(1)

Figure 6:
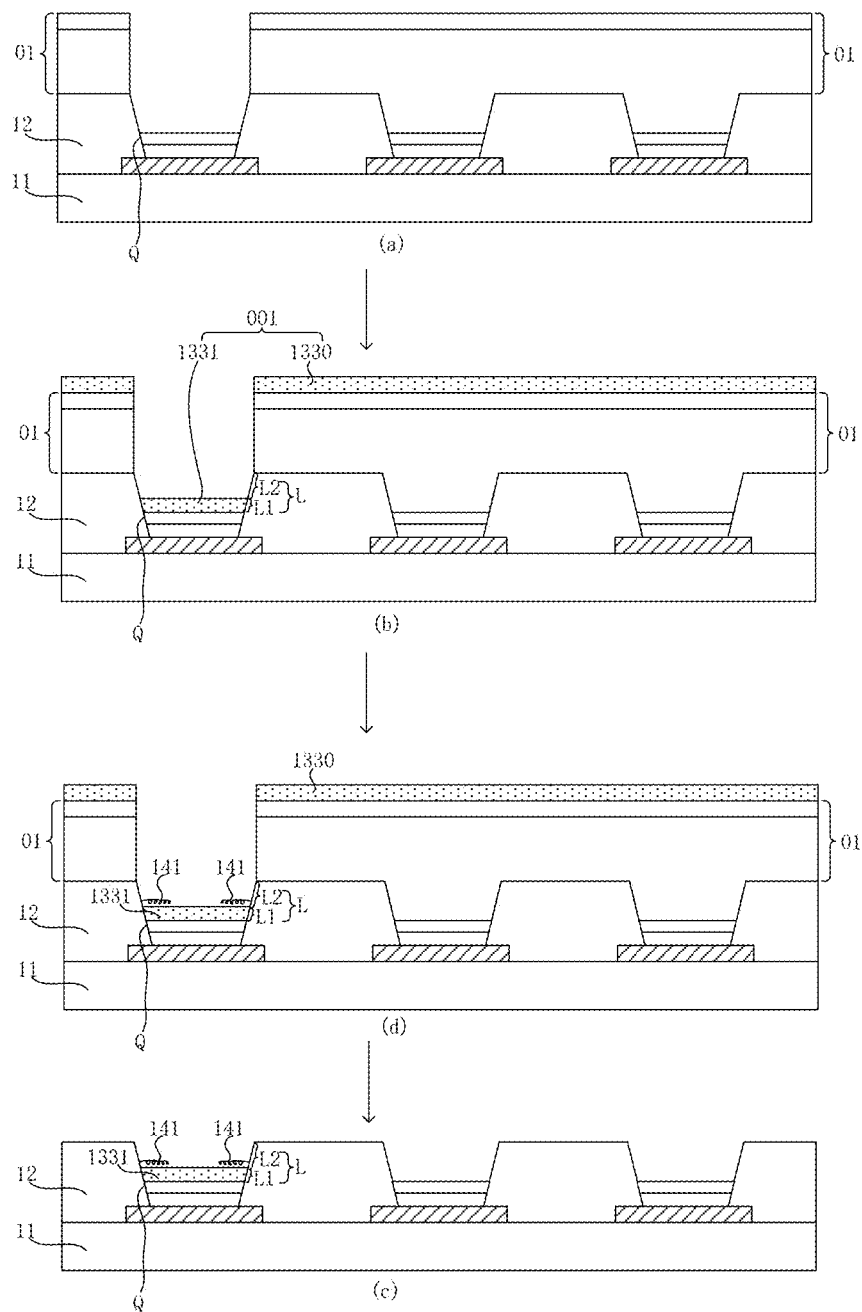
FIG. 6 is a flow diagram of another method for manufacturing a light-emitting substrate, in accordance with some embodiments.

Based on this, as shown in FIGS. 6 and 4, in the above process of forming the quantum dot light-emitting pattern 1331 in the at least one opening Q by the spin coating process, as shown in part (d) of FIG. 6, before removing the mask 01, at least one siloxane segment 141 may be grafted to the second portion L2 of the side wall L of the opening Q in which the quantum dot light-emitting pattern 1331 has been formed. In this way, in one aspect, since the siloxane segment 141 is connected to the side wall L through a chemical bond, and the siloxane segment 141 itself has good thermal stability and chemical stability, the siloxane segment 141 will not be easily dissolved when the mask 01 is dissolved and removed, and may provide protection for the quantum dot light-emitting material in the quantum dot light-emitting pattern 1331. In another aspect, the macromolecular chain of the siloxane segment 141 may physically block the quantum dot light-emitting material in the quantum dot light-emitting pattern 1331 and thus prevent the quantum dot light-emitting material from being dissolved and lost. In this way, it may be possible to solve the problem in the related art that considerable loss of the quantum dot light-emitting material in the quantum dot light-emitting pattern 1331 affects the performance of the light-emitting device 13.

In addition, according to the positions of the anodes and the cathodes of the light-emitting devices 13, the light-emitting devices 13 may be classified into "upright" type light-emitting devices (as shown in FIG. 1) and "inverted" type light-emitting devices (as shown in FIG. 2). For the "upright" type light emitting devices, the anode is closer to the substrate than the cathode. That is, the "upright" type light-emitting device only indicates a structure of "anode down, cathode above".

In a case where the anode is made of a transparent oxide semiconductor material such as indium tin oxide (ITO) or zinc oxide (ZnO), or the cathode is made of a low work function material such as Al or Ag, the anode is transparent with a small thickness (or, if the anode has a large thickness, it will have only a certain transmittance, and is usually called "translucent"), and the cathode is opaque with a large thickness (here, if the cathode is made of the above metal materials, in addition to the large thickness, the cathode may also reflect light to a certain degree, and thus improve the light exiting efficiency of the light-emitting device). As a result, the light emitted by the quantum dot light-emitting pattern 1331 passes through the anode and exit from the substrate 11, which is commonly called "downward emission" or "bottom emission". Such emission type is shown in FIG. 1.

In a case where the anode is opaque and the cathode is transparent or translucent, the emission type of the "upright" type light-emitting device may be opposite to the emission type in FIG. 1. That is, the light emitted by the quantum dot light-emitting pattern 1331 will not exit from the substrate 11. Instead, it exits from the cathode, which is commonly referred to as "upward-emission", or "top-emission". In a top-emission light-emitting device, the anode is usually of a stacked structure of a metal and a transparent oxide semiconductor (e.g. ITO), and is represented by "metal/ITO". The ITO is in contact with the hole transport layer for providing the holes due to the action of an applied electric field, and the metal is located on the side of the ITO facing away from the hole transport layer to reflect the light to a certain degree. The cathode is typically made of metal with a thin thickness and is translucent.

In a case where the anode is transparent (or translucent) and the cathode is transparent (or translucent), the light emitted by the quantum dot light-emitting pattern 1331 includes both a portion exiting from the substrate 11 and a portion exiting from the cathode, which is commonly referred to as "double-sided emission" or "dual-side emission".

It can be seen that the emission types depend on the specific structure of the electrodes (i.e., the materials of the electrodes and/or the thicknesses of the electrodes). The term "upright type light-emitting device" does not necessarily have a corresponding relationship with any one of "bottom emission", "top emission", and "dual-side emission", and the term "upright" is only used to describe the manner that the cathode is disposed above the anode.

Figure 7:
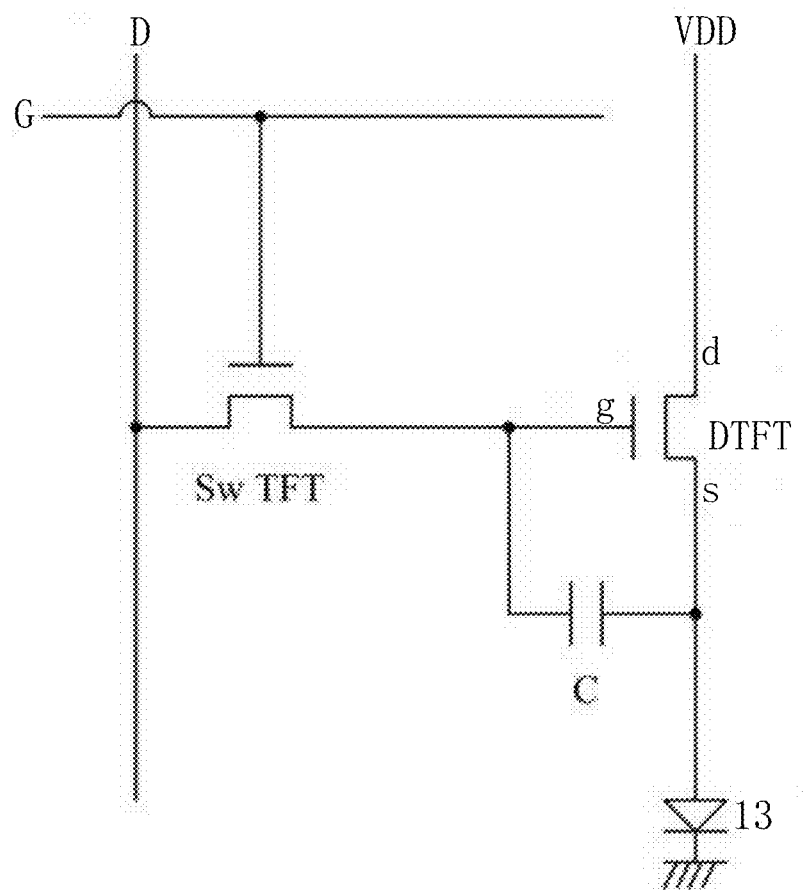
FIG. 7 is an equivalent circuit diagram of a 2T1C pixel driving circuit, in accordance with some embodiments.
Figure 8:
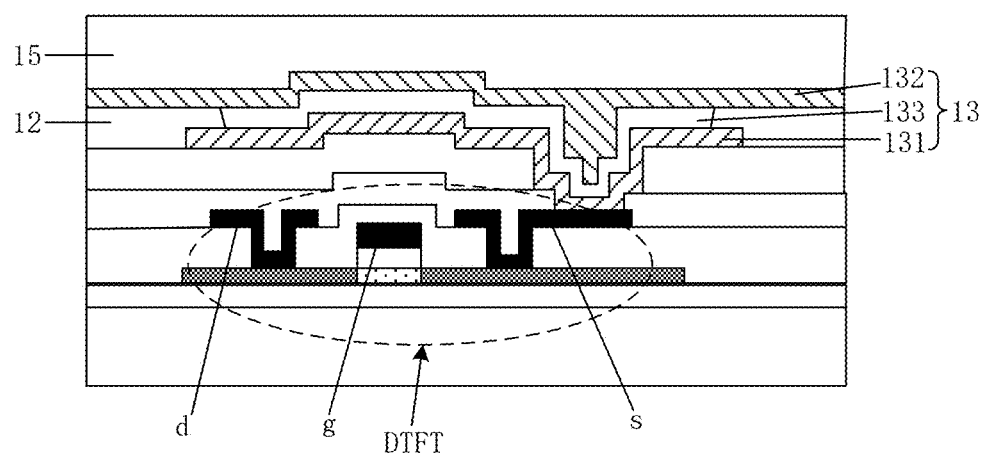
FIG. 8 is a sectional view of the light-emitting substrate shown in FIG. 7.

As shown in FIGS. 7 and 8, considering the pixel driving circuit 200 with a typical 2T1C structure as an example, the anode of the "upright" type light-emitting device is connected to an electrode (e.g., a source) of a driving thin film transistor (DTFT).

That is, in the equivalent circuit shown in FIG. 7, the "upright" type light-emitting device is disposed at a position proximate to the ground side of the DTFT (FIG. 7 only shows an example where the DTFT is an n-type DTFT). The anode (i.e., the first electrode 131 located at the lower part in FIG. 8) of the "upright" type light-emitting device is connected to the source s of the DTFT, so as to receive the forward voltage output from the source s of the DTFT. The cathode (i.e., the second electrode 132 located at the upper part in FIG. 8) of the "upright" type light-emitting device is grounded, which is equivalent to being connected to a negative potential.

However, in the "upright" type light-emitting device, in a case where the electron injection layer is made of an alkali metal (for example, at least one of lithium or cesium), and the cathode is made of Al or Ag, due to the high reactivity of these metal materials, oxidation will occur when they encounter oxygen and moisture in the air, resulting in the failure of the light-emitting device. Therefore, the cathode located above and the electron injection layer located proximate the cathode are very easily eroded, and usually need to be sealed with glass and adhesive (which has a better water and oxygen isolation effect than thin film encapsulation).

As for the "inverted" light-emitting device, the cathode is closer to the substrate than the anode. That is, the "inverted" light-emitting device has a structure of "cathode down, anode above". In the "inverted" light-emitting device, in a case where the cathode is made of ITO and other materials, compared with the "upright" type light-emitting device in which the cathode is made of Al and other materials, since the cathode is located below, the atmospheric stability of the cathode may be greatly improved, which may improve the service life of the "inverted" light-emitting device.

In addition, if the electron injection layer formed on the cathode is made of an inert material, an oxygen-resistant and water-resistant light-emitting device may be realized. Therefore, the necessity of using hard encapsulation materials with high barrier properties may be reduced.

In the case where the cathode is made of ITO and other materials, since the cathode is transparent, the emission type of the "inverted" type light-emitting device with this structure is the same as that of the "upright" type light-emitting device shown in FIG. 1, that is, also bottom-emission type. In a case where the cathode is opaque, for example, the cathode is made of an opaque material (which also includes a situation where the material used by the cathode has a large thickness and causes the cathode to be opaque), the emission type is opposite to that shown in FIG. 1, that is, top-emission type.

Figure 9:
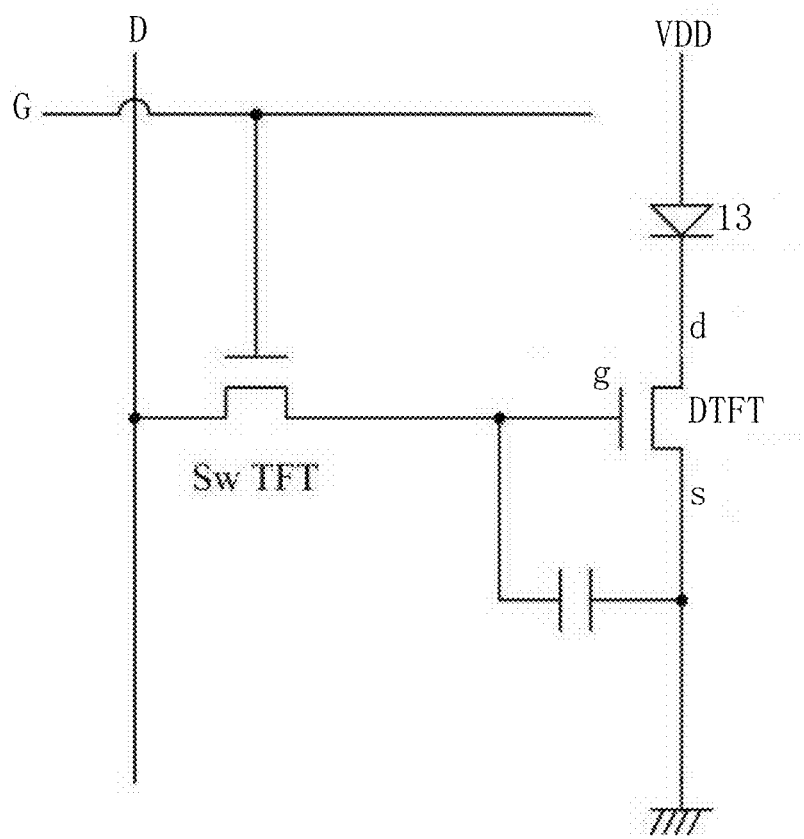
FIG. 9 is an equivalent circuit diagram of another 2T1C pixel driving circuit, in accordance with some embodiments.
Figure 10:
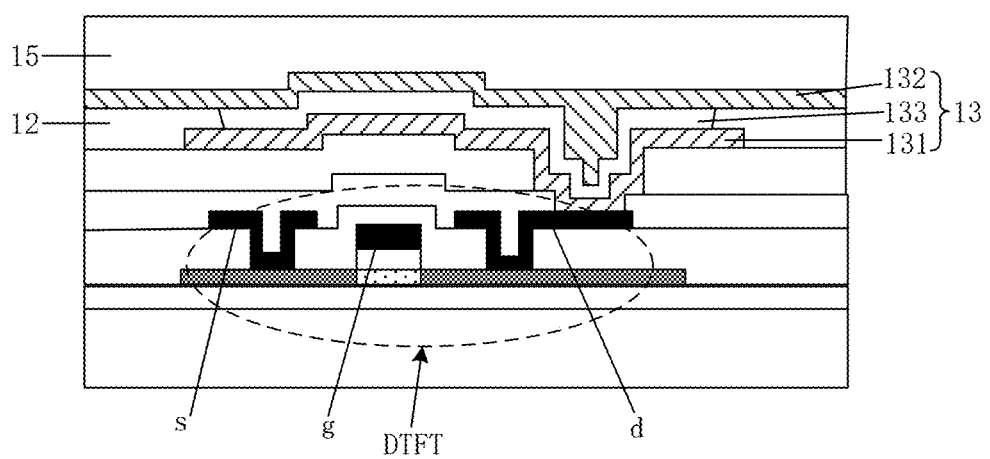
FIG. 10 is a sectional view of the light-emitting substrate shown in FIG. 9.

As shown in FIGS. 9 and 10, still considering the pixel driving circuit 200 with a typical 2T1C structure as an example, since the cathode is located below and the anode is located above in the "inverted" type light-emitting device, the cathode is connected to the other electrode of the DTFT, for example, the drain d. As a result, the circuit connection manner of the pixel driving circuit 200 is different from that shown in FIG. 7, and the "inverted" type light-emitting device needs to be disposed at the side of the gate line in the equivalent circuit shown in FIG. 9. This is because no matter whether it is an "upright" type light-emitting device or an "inverted" type light-emitting device, in order to facilitate the independent control of each light-emitting device 13 and for the convenience of fabrication, the first electrode 131 located below (i.e., the anode in the "upright" type light-emitting device, or the cathode in the "inverted" type light-emitting device) is only located in a corresponding sub-pixel area. That is to say, the first electrodes 131 located below of the light-emitting devices 13 are not in contact with each other. The second electrodes 132 located above (i.e., the cathode in the "upright" type light-emitting device, or the anode in the "inverted" type light-emitting device) of the light-emitting devices 13 do not need to be fabricated into independent components for the sake of simplifying the process, and the second electrodes 132 located above of the light-emitting devices 13 are usually connected to each other, that is, are made into a whole layer. Therefore, in this fabrication method, if the DTFT is connected to the second electrode 132 located above of the light-emitting device 13, firstly, the second electrodes 132 located above of the light-emitting devices 13 need to be independent of each other. That is to say, the second electrodes 132 located above of the light-emitting devices 13 cannot be made into the whole layer where they are connected to each other. Secondly, the drain d or the source s of the DTFT needs to pass through a plurality of layers and bypass all other conductive structures to be electrically connected to the second electrode 132 located above. In consideration of the manufacturing difficulty, stability and yield, no matter whether it is the "upright" type light emitting device or the "inverted" type light emitting device, the DTFT is always electrically connected to the first electrode 131 located below.

Therefore, as shown in FIG. 9, the anode of the "inverted" type light emitting device (i.e., the second electrode 132 located above as shown in FIG. 2) is loaded with the power supply voltage VDD, while the cathode of the "inverted" type light emitting device (i.e., the first electrode 131 located below as shown in FIG. 10) is connected to the drain d of the DTFT, which is equivalent to being connected to a negative potential.

With reference to the two circuit diagrams of FIG. 7 and FIG. 9, an example is considered where the DTFT in each circuit diagram is the n-type TFT, and the current flowing through each light-emitting device is based on the voltage (VGS) applied between the source s and the gate g of the DTFT. Referring first to the circuit diagram including the "upright" type light-emitting device in FIG. 7, since the anode of the "upright" type light-emitting device is connected to the source s of the DTFT, and the driving voltage of the light-emitting device between the ground and the source s of the DTFT slowly increases while driving the light-emitting device 13, the voltage reference of the DTFT (i.e., the voltage of the source electrode s) will also change due to its influence, resulting in a drop in the VGS of the DTFT and a decrease in the current flowing through the light-emitting device 13. Eventually, the brightness of the light emitted by the light-emitting device 13 may be reduced. If the reference voltage is increased to increase the brightness, the light-emitting device 13 may be easily burnt or there may be other problems. The cathode of the "inverted" type light-emitting device is connected to the drain d of the DTFT, the source s of the DTFT can be fully grounded, and the VGS will not change when the "inverted" type light-emitting device is driven. As a result, the current flowing through the light-emitting device may remain stable, thus the device may not be burnt, and other problems may not occur.

Moreover, compared with disadvantages of high cost and only small-area application of the LTPS (Low Temperature Poly-silicon) process, the "inverted" type light-emitting device can be integrated with a mature n-channel a-Si-based TFT driving circuit, so as to fabricate large-area display substrates at a low cost.

In addition, as for the quantum dot light-emitting device, since currently, the hole transport layer 1332 may be made of an organic polymer material, and the electron transport layer 1333 may be made of zinc oxide and other inorganic materials, in the embodiments, by adopting the "inverted" type light-emitting device, it may be possible to fabricate the quantum dot light-emitting pattern 1331 on a relatively stable substrate 11, and avoid fabricating the quantum dot light-emitting pattern 1331 on a substrate 11 having the hole transport layer 1332. When the mask 01 is dissolved using a chemical reagent, the hole transport layer 1332 made of the organic polymer material will also be dissolved, which is unfavorable for the fabrication.

Based on this, in the embodiments, the inventor fabricated three groups of comparative samples with "inverted" light-emitting devices by controlling the process parameters (such as spin coating speed) in the spin coating process. Comparative sample 1 is fabricated using the manner provided in the embodiments; as shown in FIG. 6, at least one siloxane segment 141 is grafted to the second portion L2 of the side wall L of the opening Q before the mask 01 is removed, and the corresponding quantum dot light-emitting pattern 1331 is formed in the opening Q. Comparative sample 2 is fabricated using a method in the related art; as shown in FIG. 4, the mask 01 is directly removed, and the corresponding quantum dot light-emitting pattern 1331 is formed in the opening Q. Comparative sample 3 is obtained by direct spin-coating of the quantum dot light-emitting material without forming a mask 01 during the manufacturing process. The three comparative samples are all light-emitting substrates 1 formed with green quantum dot light-emitting patterns, and the thicknesses of the green quantum dot light-emitting patterns formed after spin coating are all 80 nm.

Scanning electron microscope-energy dispersive spectrometer (SEM-EDS) is used to analyze elements of the sections of the three comparative samples, and the current-voltage characteristic curves (I-V curves) of the three comparative samples are tested. The results are shown in FIGS. 11A, 11B, 11C and 12.

Figure 11A:
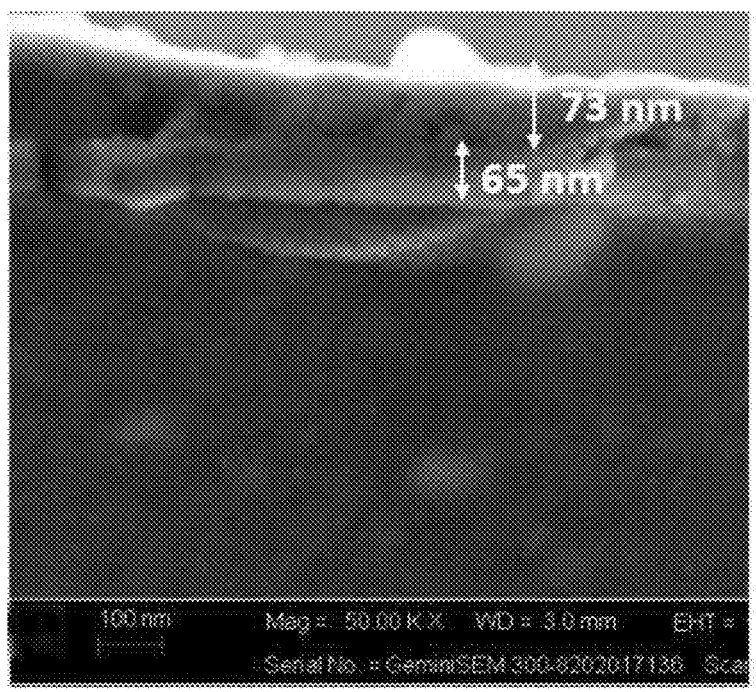
FIG. 11A is a scanning electron microscope-elemental analysis diagram of comparative sample 1.
Figure 11B:
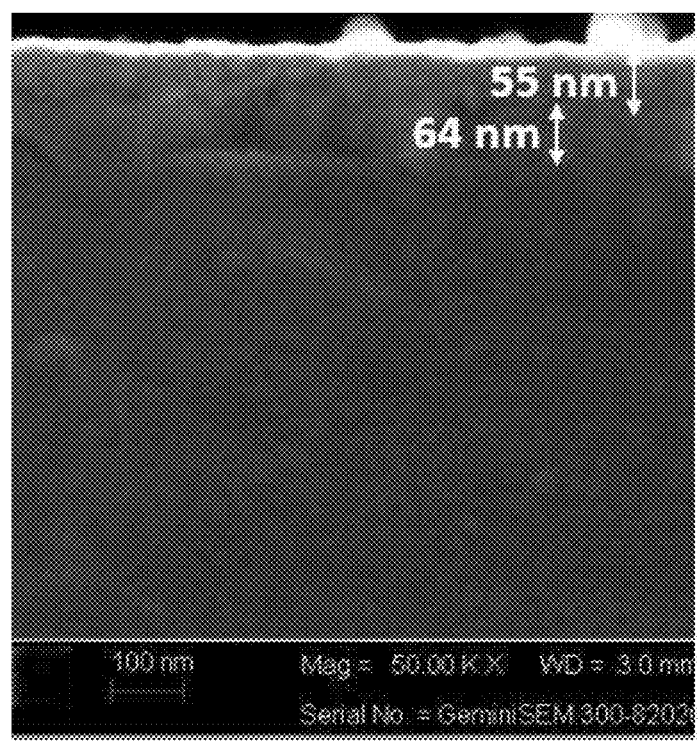
FIG. 11B is a scanning electron microscope-elemental analysis diagram of comparative sample 2.
Figure 11C:
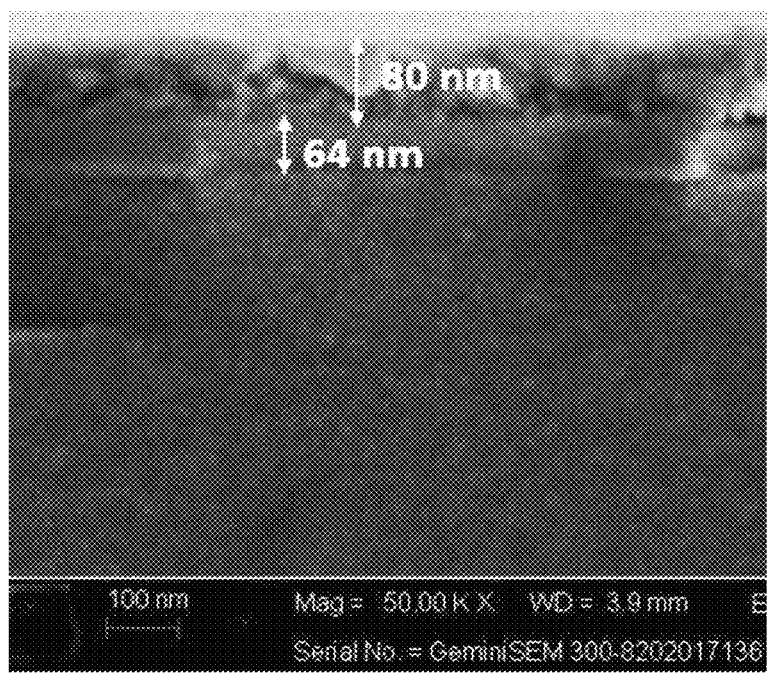
FIG. 11C is a scanning electron microscope-elemental analysis diagram of comparative sample 3.

As can be seen from the results shown in FIGS. 11A, 11B and 11C, the thickness of the quantum dot light-emitting pattern of Comparative sample 1 is about 73 nm, the thickness of the quantum dot light-emitting pattern of Comparative sample 2 is about 55 nm, and the thickness of the quantum dot light-emitting pattern of Comparative sample 3 is about 80 nm. It can be seen that, the quantum dot light-emitting material in the quantum dot light-emitting pattern 1331 that is not grafted with the siloxane segment 141 has fallen off in great amounts, and the quantum dot light-emitting material in the quantum dot light-emitting pattern 1331 grafted with the siloxane segment 141 has only fallen off in small amounts. It is further illustrated that the siloxane segment 141 may prevent the quantum dot light-emitting material in the quantum dot light-emitting pattern 1331 from falling off.

Figure 12:
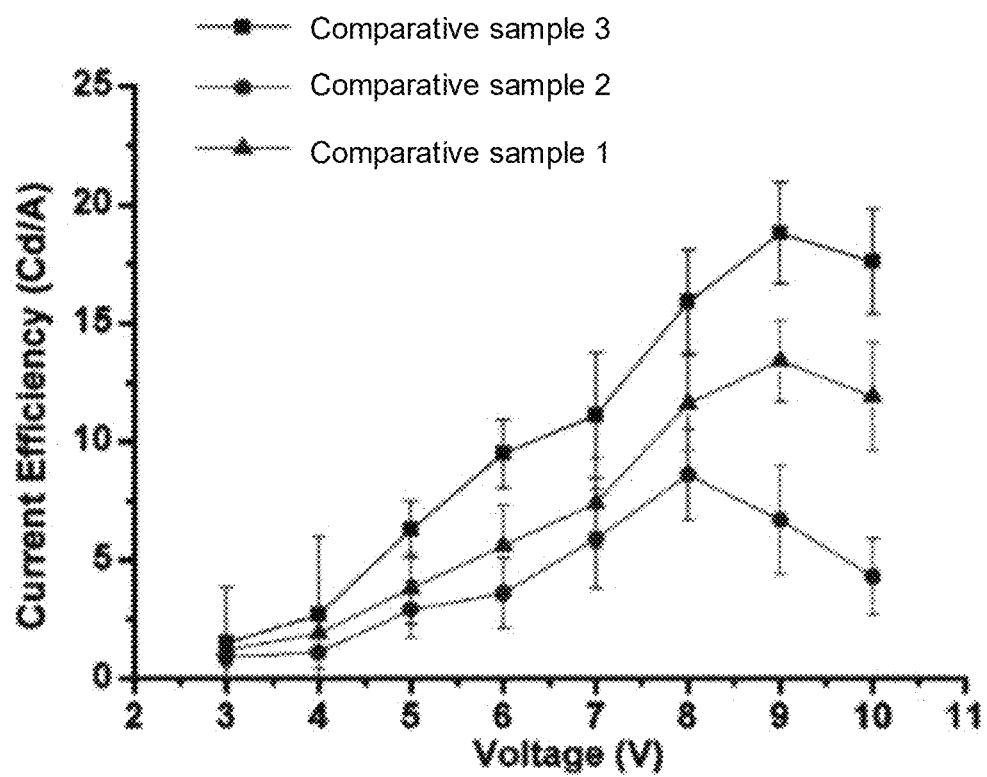
FIG. 12 is a comparison diagram of the current-voltage (I-V) characteristic curves of comparative samples 1-3.

As can be seen from the results shown in FIG. 12, the I-V characteristic curve of Comparative sample 3 is the best, followed by that of Comparative sample 1, and the I-V characteristic curve of Comparative sample 2 is the worst, which further confirms that the siloxane segment 141 may protect the quantum dot light-emitting material in the quantum dot light-emitting pattern 1331, prevent the quantum dot light-emitting material from falling off, and thus improve the performance of the light-emitting device 13.

Based on the above structure, in some other embodiments, as shown in FIG. 5, the plurality of light-emitting devices 13 include a plurality of types of light-emitting devices emitting different colors of light. Second portions L2 of the side walls L corresponding to each kind of light-emitting devices are each grafted with the at least one siloxane segment 141.

In these embodiments, for example, the plurality of light-emitting devices 13 include three types of light-emitting devices emitting different colors of light. During fabrication, the steps shown in FIG. 6 may be repeated three times to sequentially form quantum dot light-emitting patterns 1331 emitting light of a first color, quantum dot light-emitting patterns 1331 emitting light of a second color, and quantum dot light-emitting patterns emitting light of a third color in respective openings Q (corresponding to three types of light-emitting devices emitting different colors of light). In addition, before the quantum dot light-emitting patterns 1331 emitting each color of light are formed, the second portions L2 of the side walls L of the openings Q corresponding to the quantum dot light-emitting patterns 1331 emitting the color of light are each grafted with at least one siloxane segment 141. In this way, in the subsequent process of removing the mask 01, the at least one siloxane segment 141 may be used to protect the quantum dot light-emitting material in the quantum dot light-emitting pattern 1331 located in the opening Q, so as to prevent the quantum dot light-emitting material being washed away and avoid the loss of the quantum dot light-emitting material. As a result, it may be possible to ensure that the three types of quantum dot light-emitting patterns 1331 emitting different colors of light all maintain the thickness thereof after spin coating, and thus ensure the light-emitting efficiency of the light-emitting devices.

Here, it will be noted that the embodiments of the present disclosure only describe a case where the blocking unit 14 is applied to a light-emitting substrate emitting light of various colors fabricated by a plurality of spin coating processes, and those skilled in the art will understand that the embodiments of the present disclosure are also applicable to a light-emitting substrate emitting monochromatic light or white light fabricated by a single spin coating process. For example, they are also applicable to a case where the material of each quantum dot light-emitting pattern 1331 in the light-emitting substrate 1 includes a mixed material of red quantum dot light-emitting material, green quantum dot light-emitting material and blue quantum dot light-emitting material, or a case where the material of each quantum dot light-emitting pattern 1331 in the light-emitting substrate is a red quantum dot light-emitting material, a green quantum dot light-emitting material, or a blue quantum dot light-emitting material.

The manner of grafting at least one siloxane segment 141 in each blocking unit 14 to the second portion L2 of the side wall L is not limited.

In some embodiments, as shown in FIG. 13, the at least one siloxane segment 141 in each blocking unit 14 is bonded to an oxygen atom O in the second portion L2 of the side wall L, so as to graft the at least one siloxane segment 14 to the side wall L of the second portion L2.

That is, the at least one siloxane segment 141 may be formed by a hydrolysis reaction between a first reactant and oxygen atom(s) O in the second portion L2 of the side wall L. This reaction is simple and only requires mild conditions.

The structural formula of the first reactant may be shown in the following formula (1). Here, $R_1$ is any one of an alkoxy group, an acyloxy group, and a ketoxime group; $R_2$ is any one of a hydrogen atom, an alkyl group, an alkenyl group, and an aryl group; and $R_3$ and $R_4$ are each any one of a hydrogen atom, an alkoxy group, a hydroxy group, an acyloxy group, a ketoxime group, an alkyl group, an alkenyl group, and an aryl group.

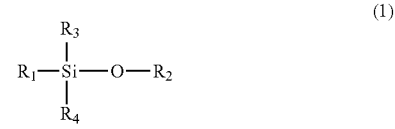

(1)

Figure 14:
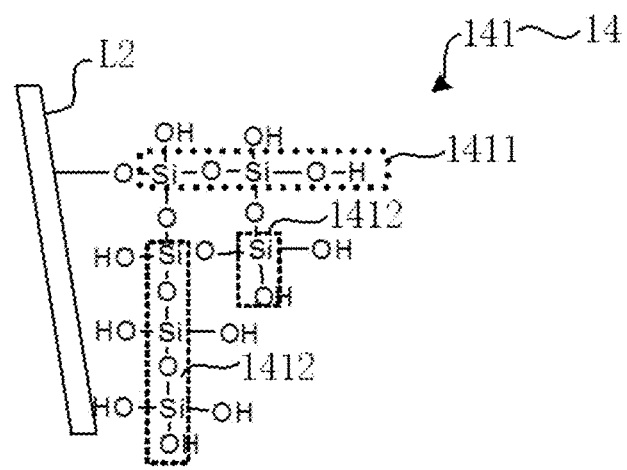
FIG. 14 is a structural diagram of a blocking unit, in accordance with some embodiments.

In some other embodiments, as shown in FIG. 14, each siloxane segment 141 includes a first sub-segment 1411 bonded to the oxygen atom O in the second portion L2 of the side wall L, and at least one second sub-segment 1412. Each second sub-segment 1412 is bonded to a silicon atom in the first sub-segment 1411. The number of silicon-oxygen bonds (Si—O) in the first sub-segment 1411 is in a range from 1 to 25, inclusive, and the total number of silicon-oxygen bonds (Si—O) in the second sub-segment 1412 bonded to the same silicon atom in the first sub-segment 1411 is in a range from 0 to 24, inclusive.

Figure 15:
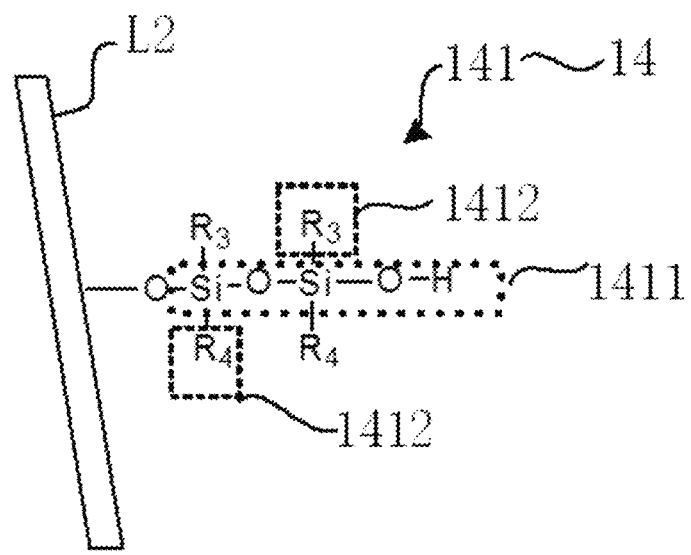
FIG. 15 is a structural diagram of another blocking unit, in accordance with some embodiments.

In these embodiments, in a case where the number of the silicon-oxygen bonds (Si—O) in the first sub-segment 1411 is one or more, $R_1$ in the first reactant may be any one of the alkoxy group, the acyloxy group, and the ketoxime group; $R_2$ may be any one of the hydrogen atom, the alkyl group, the alkenyl group, and the aryl group; $R_3$ may be any one of the hydrogen atom, the hydroxyl group, the alkyl group, the alkenyl group, and the aryl group, and $R_4$ may be any one of the hydrogen atom, the hydroxyl group, the alkyl group, the alkenyl group, and the aryl group. In this case, as shown in FIG. 15, each second sub-segment 1412 may be an alkyl group, an alkenyl group or an aryl group, and the number of silicon-oxygen bonds in each second sub-segment 1412 is zero.

Figure 16:
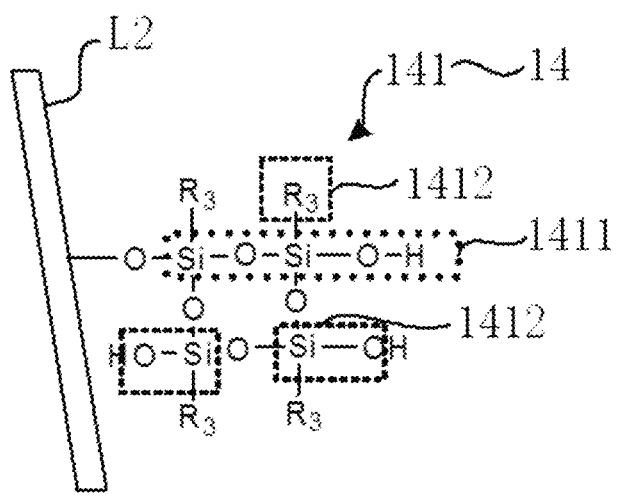
FIG. 16 is a structural diagram of yet another blocking unit, in accordance with some embodiments.

Alternatively, $R_1$ in the first reactant may be any one of the alkoxy group, the acyloxy group and the ketoxime group; $R_2$ is any one of the hydrogen atom, the alkyl group, the alkenyl group and the aryl group; $R_3$ may be any one of the hydrogen atom, the hydroxyl group, the alkyl group, the alkenyl group, the aryl group, the alkoxy group, the acyloxy group and the ketoxime group, and $R_4$ may be any one of the alkoxy group, the acyloxy group and the ketoxime group. In this case, each second sub-segment 1412 may include a single silicon-oxygen bond. As shown in FIG. 16, the number of silicon-oxygen bonds in each second sub-segment 1412 is one. Alternatively, as shown in FIG. 14, each second sub-segment 1412 includes a plurality of silicon-oxygen bonds.

Figure 17:
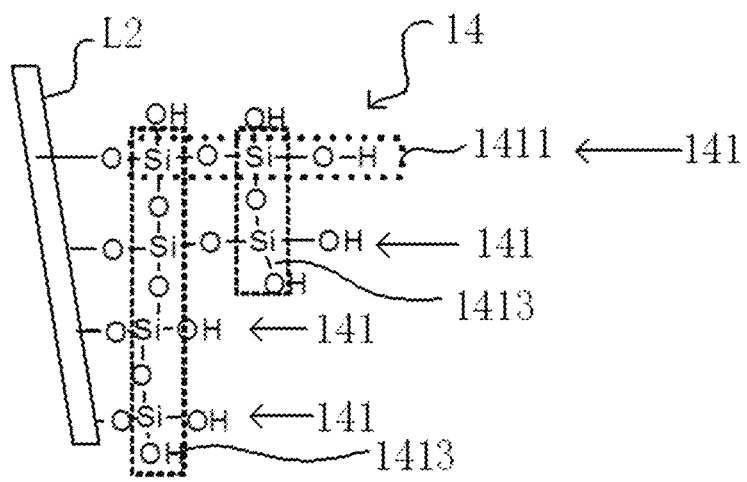
FIG. 17 is a structural diagram of yet another blocking unit, in accordance with some embodiments.
Figure 18:
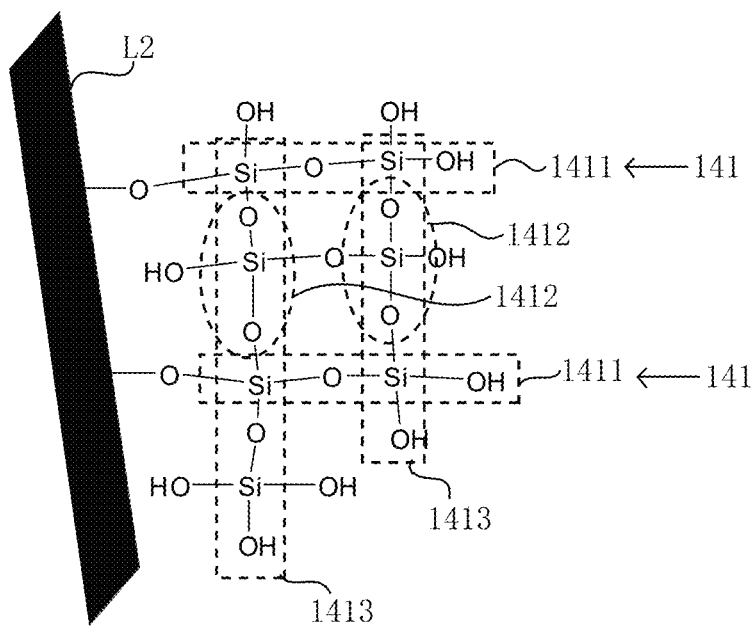
FIG. 18 is a structural diagram of yet another blocking unit, in accordance with some embodiments.

In some other embodiments, as shown in FIGS. 17 and 18, each blocking unit 14 includes at least two siloxane segments 141. The at least two siloxane segments 141 are cross-linked with each other to form at least one third sub-segment 1413, and the number of silicon-oxygen bonds in each third sub-segment 1413 is in a range from 2 to 25, inclusive.

In these embodiments, $R_3$ may be any one of the hydrogen atom, the hydroxyl group, the alkyl group, the alkenyl group, the aryl group, the alkoxy group, the acyloxy group and the ketoxime group, and $R_4$ may be any one of the alkoxy group, the acyloxy group and the ketoxime group. In this case, as shown in FIG. 18, the third sub-segments 1413 in the at least two siloxane segments 141 may be formed by cross-linking the second sub-segments 1412 with each other. Alternatively, as shown in FIG. 17, the third sub-segments 1413 in the at least two siloxane segments 141 may be directly formed by cross-linking the first sub-segment 1411 with each other.

In the above embodiments, based on a case that the diameter of a silicon atom is 0.117 nm, the diameter of an oxygen atom is 0.148 nm, and the number of silicon-oxygen bonds in the first sub-segment 1411 in each blocking unit 14 is in a range from 1 to 25, inclusive, in a case where each blocking unit 14 includes a single siloxane segment 141, by controlling the total number of silicon-oxygen bonds in the second sub-segment 1412 bonded to the same silicon atom in the first sub-segment 1411 to be in a range of 0 to 24, and in a case where each blocking unit 14 includes at least two siloxane segments 141, by controlling the number of silicon-oxygen bonds in the third sub-segment 1413 to be in a range of 2 to 25, it may both be possible to control the thickness of the siloxane segment 141 in the blocking unit 14 in the direction perpendicular to the side wall L and in the thickness direction of the quantum dot light-emitting pattern 1331 to be in a range of 0.265 nm to 6.625 nm. In this way, it may not only be possible to protect the quantum dot light-emitting material in the quantum dot light-emitting pattern 1331, but it may also be possible to prevent an excessive thickness from affect the migration of holes.

The material of the pixel defining layer 12 is not limited. For example, the material of the pixel defining layer 12 includes a hydroxyl-containing polymer material or a silicon-containing inorganic oxide material.

In a case where the material of the pixel defining layer 12 includes the hydroxyl-containing polymer material, the first reactants and the hydroxyl groups in the second portion L2 of the side wall L undergo a hydrolysis reaction. In a case where the material of the pixel defining layer 12 includes the silicon-containing inorganic oxide material, the first reactants and the oxygen atoms in the second portion L2 of the side wall L undergo a hydrolysis reaction.

In the case where the material of the pixel defining layer 12 includes the silicon-containing inorganic oxide material, the material of the first reactant is similar to the material of the pixel defining layer 12. It has good compatibility and may improve the graft stability of the siloxane compound to the second portion of the side wall.

Optionally, the hydroxyl-containing polymer material includes one or more of polyethylene glycol, polyvinyl acetate, cellulose and chitosan.

Figure 19:
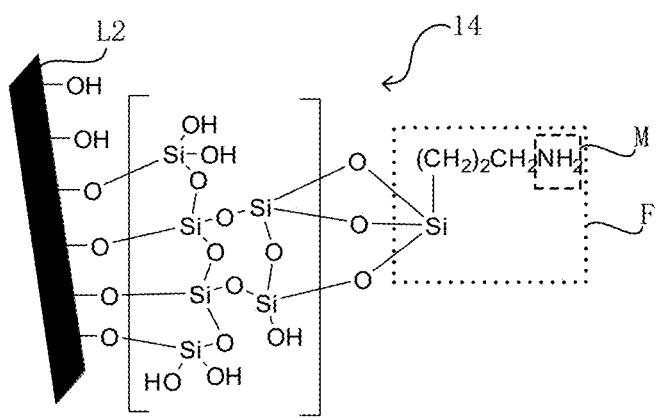
FIG. 19 is a structural diagram of yet another blocking unit, in accordance with some embodiments.
Figure 20:
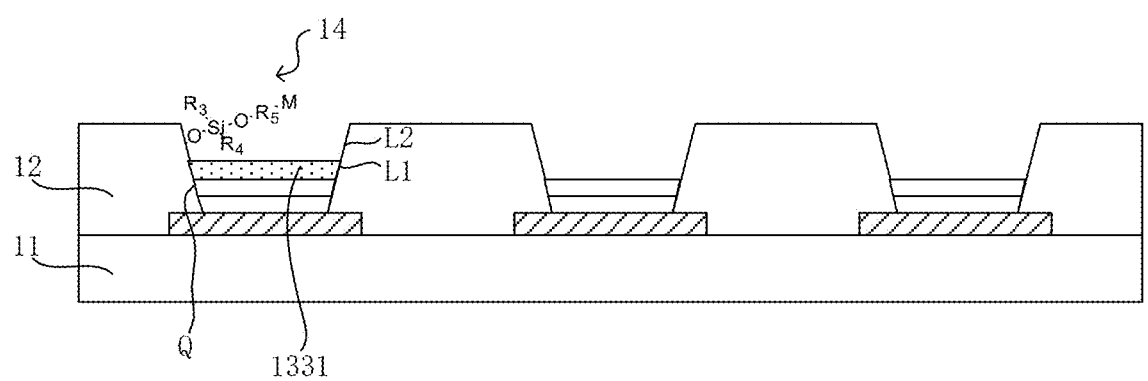
FIG. 20 is a sectional view of yet another light-emitting substrate, in accordance with some embodiments.

In some embodiments, as shown in FIG. 19 and FIG. 20, each blocking unit 14 further includes at least one coordinating group M, each coordinating group M is grafted to one or more siloxane segments 141, and each coordinating group M is bonded to at least one quantum dot in a corresponding quantum dot light-emitting pattern 1331.

In these embodiments, by adding the coordinating group M and combining the coordinating group M with at least one quantum dot in the quantum dot light-emitting pattern 1331, it may be possible to coordinate and adsorb the quantum dots in the quantum dot light-emitting pattern 1331, fix the quantum dot light-emitting material in the quantum dot light-emitting pattern 1331, and thus further prevent the quantum dot light-emitting material in the quantum dot light-emitting pattern 1331 from falling off.

The quantum dots in the quantum dot light-emitting material are usually semiconductor nanocrystals, and the semiconductor for forming the semiconductor nanocrystals may include group IV elements, II-VI compounds, II-V compounds, III-VI compounds, III-V compounds, IV-VI compounds, group Ill elements, II-IV-VI compounds, II-IV-V compounds, and alloys and/or mixtures including any of the foregoing, which includes ternary and quaternary mixtures or alloys.

Optionally, each coordinating group M includes one of a sulfur-containing group, a nitrogen-containing group, and an oxygen-containing group. For example, each coordinating group may be a sulfhydryl group, an amino group, or a hydroxyl group.

For example, the quantum dots in the quantum dot light-emitting material include one or more of ZnS, ZnSe, ZnTe, CdS, CdSe, CdTe, HgTe, InP, CuInS, CuInSe, CuInSeS and AgInS quantum dots.

Optionally, the quantum dots in the quantum dot light-emitting material may have a core-shell structure. The core may include one or more of ZnS, ZnSe, ZnTe, CdS, CdSe, CdTe, HgTe, InP, CuInS, CuInSe, CuInSeS and AgInS. The shell may be a semiconductive material having a composition different from that of the core and wrap around the exterior of the core. For example, in the embodiments, the quantum dots having the core-shell structure include CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS or PbS/ZnS quantum dots. Here, it will be noted that the material before "/" is the core, and the material after "/" is the shell.

In some embodiments, the quantum dots in the quantum dot light-emitting material may have ligands. In this case, the ligand is bonded to the quantum dot.

In the embodiments, the surface of the quantum dot may have defect sites or places not covered by ligands, so that the coordinating group M can coordinate with the quantum dot.

The coordinating group M may be formed on the second sub-segment 1412 of the siloxane segment 141. Alternatively, on a basis of the structure of the siloxane segment 141, a second reactant having the coordinating group M may be reacted with the siloxane segment(s) 141, so as to form the coordinating group M in the siloxane segment 141.

In yet some other embodiments, as shown in FIG. 19, the at least one siloxane segment 141 in each blocking unit 14 further includes a capping group F. The coordinated group M is formed on the capping group F.

In these embodiments, compared with a solution in which the coordinating group M is formed on the second sub-segment 1412, by adding the capping group F, in one aspect, it may be possible to control the progress of the hydrolysis reaction of the siloxane segment 141; in another aspect, it may be possible to ensure that the coordinating group M is formed at the end of the siloxane segment 141, and thus avoid a defect that the coordinating group M cannot be combined with the quantum dots due to a too large steric hindrance therebetween.

The capping group F may be any group that can end-cap the siloxane segment 141, which is not limited.

In yet some other embodiments, as shown in FIG. 19, the capping group F is a silane group.

In these embodiments, the capping group F may be formed by a hydrolysis reaction between the second reactant as shown in the following formula (2) and the siloxane segment 141. Where $R_1'$ is any one of an alkoxy group, an acyloxy group and a ketoxime group; $R_2'$ is any one of first hydrocarbyl groups of aliphatics, aromatics or mixed of aliphatics and aromatics that are branched or unbranched and saturated or unsaturated, the first hydrocarbyl group having a coordinating group M; $R_3'$ and $R_4'$ are each any one of a hydrogen atom, an alkoxy group, an acyloxy group, a ketoxime group, and second hydrocarbyl groups of aliphatics, aromatics or a mixture of aliphatics and aromatics that are branched or unbranched and saturated or unsaturated, the second hydrocarbon group having or not having the coordinating group M.

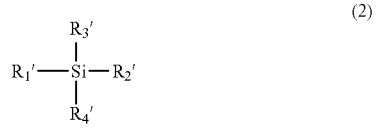

(2)

In this embodiment, since the second reactant is used, the reaction is simple and only requires mild conditions, and the obtained final structure is relatively stable.

Based on the above structure, in yet some other embodiments, the coordination atoms of the at least one coordinating group M in each blocking unit 14 account for 3.5% to 12.7% inclusive of the blocking unit 14 by mass.

In these embodiments, the coverage of the coordinating group M on the blocking unit 14 may be ensured, so that the coordinating groups M and the siloxane segments 141 may work in synergy to protect the quantum dots in the quantum dot light-emitting pattern 1331.

In yet some other embodiments, as shown in FIG. 5, the light emitting substrate 1 further includes an encapsulation layer 15 disposed on a side of the light emitting device 13 away from the substrate. The material of the encapsulation layer 15 may be an ultraviolet curing adhesive.

Figure 21:
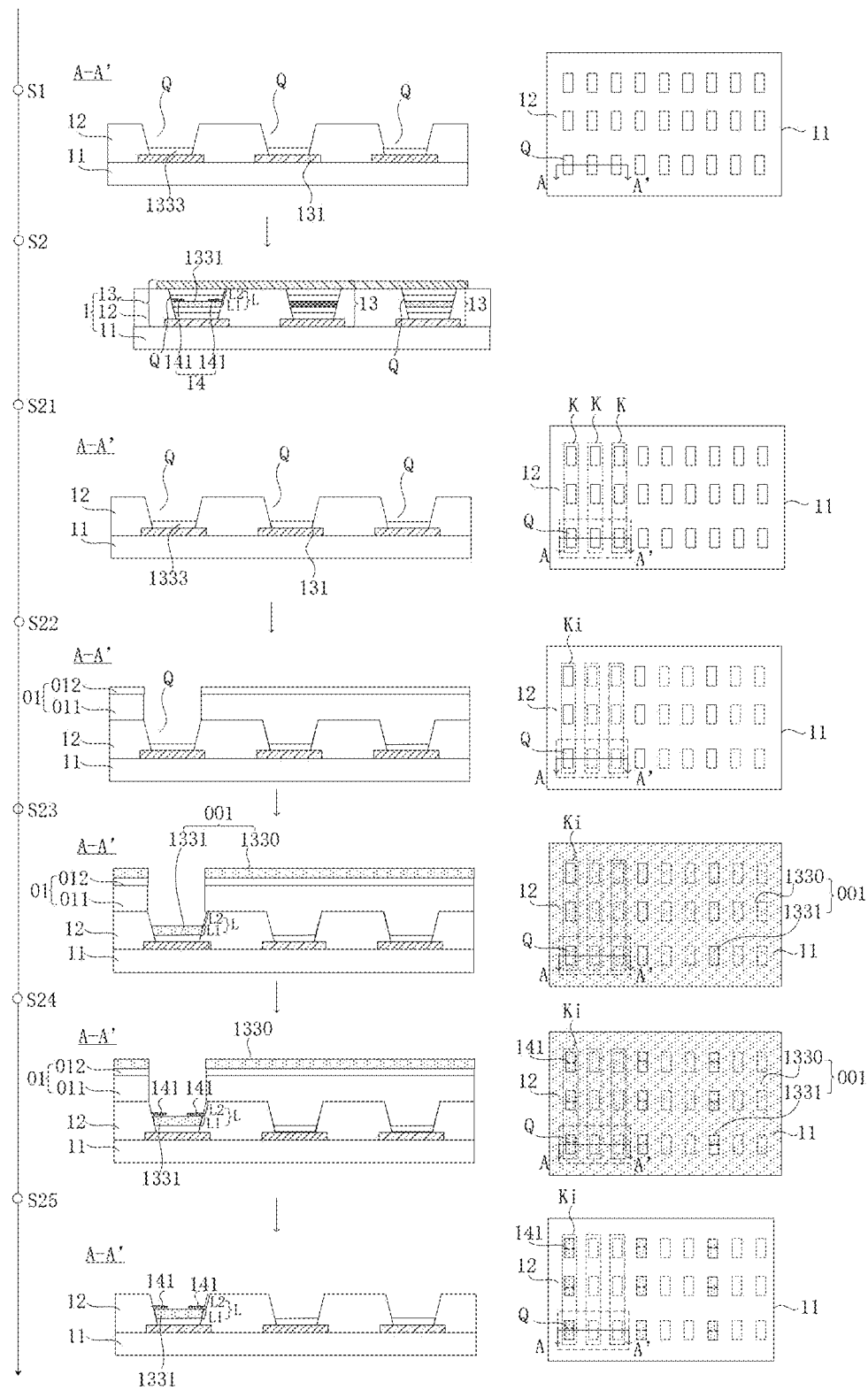
FIG. 21 is a flow diagram of yet another method for manufacturing a light-emitting substrate, in accordance with some embodiments.

Some embodiments of the present disclosure provide a method for manufacturing a light-emitting substrate. As shown in FIG. 21, the method for manufacturing the light-emitting substrate includes the following steps. In S1, forming a pixel defining layer 12 on a substrate 11, the pixel defining 12 having a plurality of openings Q.

The substrate 11 may be a substrate on which pixel driving circuits, patterned first electrodes 131 and electron transport layers 1333 have been formed.

In S2, forming a plurality of light-emitting devices 13 and at least one blocking unit 14 on the substrate 11. Each light-emitting device 13 includes a quantum dot light-emitting pattern 1331 formed in an opening Q, each blocking unit 14 includes at least one siloxane segment 141, and each siloxane segment 141 including at least one silicon-oxygen bond. Each opening Q has side wall(s) L, and a side wall L includes a first portion L1 and a second portion L2. The first portion L1 is a portion of the side wall L that is in contact with the quantum dot light-emitting pattern 1331, and the second portion L2 is a portion of the side wall L that is away from the substrate 11 relative to the first portion L1. Each blocking unit 14 is located in an opening Q, and the at least one siloxane segment 141 in each blocking unit 14 is grafted to the second portion L2 of a corresponding side wall L.

Here, the siloxane segment 141 may be formed in a single opening Q, may be formed in some of the openings Q (multiple openings Q but not all the openings Q), or may be formed in all of the openings Q.

Siloxane, a polymer with a Si—O—Si bond as the main chain, can be a linear, cyclic or cross-linked network polymer. Its structural formula is as shown in the following formula (1). Where $R_1$, $R_3$ and $R_4$ are each any one of an alkyl group, an alkenyl group, an aryl group, a hydroxyl group and a hydrogen atom, $R_2$ is a hydrogen atom, and n is a positive integer greater than or equal to 2. The siloxane segment 141 refers to a partial segment of the siloxane. Therefore, the siloxane segment 141 has a stable structure and stable chemical properties similar to those of siloxane. For example, the siloxane segment 141 may be a segment composed of one or more silicon-oxygen bonds in the siloxane as shown in the following formula (1), and is grafted to the second portion L2 of the side wall L through a silicon atom.

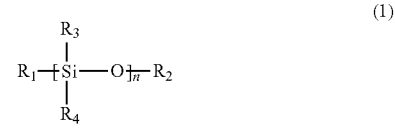

(1)

Based on this, as shown in FIGS. 6 and 4, in the above process of forming the quantum dot light-emitting pattern 1331 in the at least one opening Q by the spin coating process, as shown in part (d) of FIG. 6, before removing the mask 01, at least one siloxane segment 141 may be grafted to the second portion L2 of the side wall L of the opening Q in which the quantum dot light-emitting pattern 1331 has been formed. In this way, in one aspect, since the siloxane segment 141 is connected to the side wall L through a chemical bond, and the siloxane segment 141 itself has good thermal stability and chemical stability, the siloxane segment 141 will not be easily dissolved when the mask 01 is dissolved and removed, and may provide protection for the quantum dot light-emitting material in the quantum dot light-emitting pattern 1331. In another aspect, the macromolecular chain of the siloxane segment 141 may physically block the quantum dot light-emitting material in the quantum dot light-emitting pattern 1331 and thus prevent the quantum dot light-emitting material from being dissolved and lost. In this way, it may be possible to solve the problem in the related art that considerable loss of the quantum dot light-emitting material in the quantum dot light-emitting pattern 1331 affects the performance of the light-emitting device 13.

In some embodiments, as shown in FIG. 21, forming the plurality of light-emitting devices 13 and the at least one blocking unit 14 are formed on the substrate 11 includes the following steps (S21 to S25).

In S21, the plurality of openings Q are divided into n opening groups K, each opening group K includes at least one opening Q, and n is a positive integer greater than or equal to 2.

Here, in an example where n is equal to 3, the three opening groups K may be a first opening group K1 corresponding to the light-emitting device 13R, a second opening group K2 corresponding to the light-emitting device 13G, and a third opening group K3 corresponding to the light-emitting device 13B.

In S22, a mask 01 is formed on the substrate 11 on which the pixel defining layer 12 has been formed. The mask 01 exposes all openings Q in an i-th opening group Ki and covers at least remaining openings Q in the plurality of openings Q except for the i-th opening group Ki, and i is a value in a range from 1 to n, inclusive.

Still, in the example where n is equal to 3, i may be any one of 1 to 3.

In this case, for example, if i is equal to 2, in a process of forming the mask 01, in some embodiments, the mask 01 only exposes the openings Q in the second opening group K2. That is, the mask 01 not only covers the remaining openings Q except for the openings Q in the second opening group K2, but also covers the portions between two adjacent openings Q. In some other embodiments, the mask 01 only covers the remaining openings Q except for the openings Q in the second opening group K2, for example, in a case where the mask 01 has manufacturing errors.

In S23, a quantum dot light-emitting layer 001 is formed on the substrate 11 on which the mask 01 has been formed. The quantum dot light-emitting layer 001 includes a quantum dot light-emitting pattern 1331 located in each opening Q of the i-th opening group Ki and a reserved pattern 1330 covering the mask 01. Each opening Q of the i-th opening group Ki has side wall(s) L, and a side wall L includes a first portion L1 and a second portion L2. The first portion L1 is a portion of the side wall L that is in contact with the quantum dot light emitting pattern 1331, the second portion L2 is a portion of the side wall L that is away from the substrate 11 relative to the first portion L1.

According to the chemical properties of the quantum dot light-emitting material, in a process of patterning the quantum dot light-emitting layer 001, a solution of the quantum dot light-emitting material may be prepared first. For example, the solution of the quantum dot light-emitting material may be prepared by being dissolved in an organic solvent. When the quantum dot light-emitting layer 001 is formed on the substrate 11 on which the mask 01 has been formed, the solution of the quantum dot light-emitting material may be formed on the substrate 11 by a spin coating process. Due to the fluidity and gravity of the solution of the quantum dot light-emitting material, the solution of the quantum dot light-emitting material will not adhere to the side wall(s) L, but will all gather in the opening Q and form a quantum dot light-emitting pattern 1331 according to the shape of the opening Q. In this way, the portion (the second portion L2) of the side wall L that is not in contact with the quantum dot light emitting pattern 1331 is exposed.

In S24, the at least one siloxane segment 141 is grafted to the second portion L2 of each side wall L in the i-th opening group Ki. Each siloxane segment 141 of the at least one siloxane segment 141 includes at least one silicon-oxygen bond.

In some embodiments, quantum dot light-emitting patterns 1331 in the i-th opening group Ki (i.e., an i-th type of quantum dot light-emitting patterns 1331) may be quantum dot light-emitting patterns that emit any color of light.

In some other embodiments, the material of the pixel defining layer 12 includes a hydroxyl-containing polymer material or a silicon-containing inorganic oxide material. Grafting the at least one siloxane segment 141 to the second portion L2 of each side wall L in the i-th opening group Ki, includes:

in a case where the material of the pixel defining layer includes the hydroxyl-containing polymer material, hydrolyzing the first reactants with hydroxyl groups in the second portion L2 of each side wall L in the i-th opening group Ki; and in a case where the material of the pixel defining layer includes the silicon-containing inorganic oxide material, hydrolyzing the first reactants with oxygen atoms in the second portion L2 of each side wall L in the i-th opening group Ki. The general structural formula of the first reactant is shown in the following formula (1):

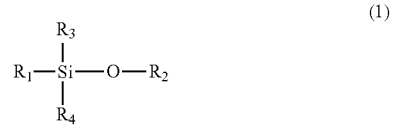

(1)

Where $R_1$ is any one of an alkoxy group, an acyloxy group, and a ketoxime group; $R_2$ is any one of a hydrogen atom, an alkyl group, an alkenyl group, and an aryl group; and $R_3$ and $R_4$ are each any one of a hydrogen atom, an alkoxy group, a hydroxy group, an acyloxy group, a ketoxime group, an alkyl group, an alkenyl group, and an aryl group.

In these embodiments, when the first reactants undergo a hydrolysis reaction with the hydroxyl groups or the oxygen atoms in the second portion L2 of each side wall L in the i-th opening group Ki, the hydrolysis reaction between the first reactants and the hydroxyl groups or the oxygen atoms in the second portion L2 of each side wall L in the i-th opening group Ki may be regarded as proceeding according to the SN2 mechanism. Since $R_1$ is any one of the alkoxy group, the acyloxy group and the ketoxime group, during the reaction, the hydroxyl group or the oxygen atom in the second portion L2 of each side wall L in the i-th opening group Ki attacks the silicon atom in the first reactant; at the same time, $R_1$ leaves, so that $R_1$ in the first reactant is replaced by the hydroxyl group or the oxygen atom in the second portion L2 of each side wall L in the i-th opening group Ki. In this case, by controlling reaction time and/or reaction conditions (e.g. reaction temperature), it may be possible to control the number of the silicon-oxygen bonds in the generated siloxane segment 141.

In the embodiments, it will be noted that, depending on which groups $R_3$ and $R_4$ are in the structural formula of the first reactant, the structure of the generated siloxane segment 141 may be different.

In an example where $R_3$ and $R_4$ in the structural formula of the first reactant are each any one of the alkyl group, the alkenyl group, and the aryl group, during the reaction, as shown in FIG. 15, the number of silicon-oxygen bonds in each siloxane segment 141 bonded to the hydroxyl group or the oxygen atom in the second portion L2 of the side wall L may be one or more. In addition, $R_3$ and $R_4$ are grafted to the siloxane segment 141 as branches of the siloxane segment 141. The number of silicon-oxygen bonds in the branches is 0.

In this case, if each blocking unit 14 includes at least two siloxane segments 141, and each siloxane segment 141 is bonded to a hydroxyl group or an oxygen atom in the second portion L2 of the side wall L, then the at least two siloxane segments 141 are not cross-linked with each other.

If one of $R_3$ and $R_4$ in the structural formula of the first reactant is any one of the alkoxy group, the acyloxy group and the ketoxime group, and the other is any one of the hydrogen atom, the alkyl group, the alkenyl group, the aryl group, the alkoxy group, the acyloxy group and the ketoxime group, as shown in FIGS. 14, 16, 17 and 18, the number of silicon-oxygen bonds in the siloxane segment 141 bonded to the hydroxyl group or the oxygen atom in the second portion L2 of the side wall L may also be 1 or more. In this case, the structure of the blocking unit 14 will vary depending on whether each blocking unit 14 includes one siloxane segment 141 or at least two siloxane segments 141.

In the case where each blocking unit 14 includes a single siloxane segment 141, as shown in FIGS. 14 and 16, the siloxane segment 141 is bonded to the hydroxyl group or the oxygen atom in the second portion L2 of the side wall L through a first sub-segment 1411, and the number of silicon-oxygen bonds in the first sub-segment 1411 may be one or more. In the meantime, at least one first reactant undergoes a hydrolysis reaction with the first sub-segment 1411 to form branches of the first sub-segment 1411 (as indicated by 1412 in FIGS. 14 and 16), so that the siloxane segment 141 has a cross-linked network structure.

In the case where each blocking unit 14 includes at least two siloxane segments 141, as shown in FIGS. 17 and 18, the blocking unit 14 may include third sub-segment(s) 1413 formed by cross-linking the at least two siloxane segments 141 with each other. Depending on whether each siloxane segment 141 has a branch (as indicated by 1412 in FIG. 18) containing silicon-oxygen bond(s), the third sub-segment 1413 may be formed by cross-linking the branches (as indicated by 1412 in FIG. 18) with each other, or by directly cross-linking the first sub-segments 1411 with each other (as shown in FIG. 17).

In other embodiments, hydrolyzing the first reactants with the hydroxyl groups or the oxygen atoms in the second portion L2 of each side wall L in the i-th opening group Ki, includes:

bringing the first reactants into contact with the second portion L2 of each side wall L in the i-th opening group Ki in a pH range of 8~11, so that the first reactants and the hydroxyl groups or the oxygen atoms in the second portion L2 of each side wall L in the i-th opening group Ki undergo a hydrolysis reaction.

The solution of the first reactant may be prepared first, then ammonia water is added to the solution of the first reactant to adjust the pH value to be in the range of 8 to 11. Then, the solution of the first reactant is dropped onto the substrate 11 on which the mask 01 has been formed, and the first reactant is brought into contact with the second portion L2 of each side wall L in the i-th opening group Ki by spin coating, so that the first reactant and the hydroxyl group or the oxygen atom in the second portion L2 of each side wall L in the i-th opening group Ki undergo the hydrolysis reaction.

The hydrolysis reaction may be carried out at room temperature, the time of the hydrolysis reaction can be 1 h to 2 h, and the rotation speed of the spin coating may be 1000 rpm to 4000 rpm. In this process, by controlling the rotation speed of the spin coating, it may be possible to control the number of silicon-oxygen bonds in the first sub-segment 1411 in the siloxane segment 141, and the number of silicon-oxygen bonds in the second sub-segment 1412 or the number of silicon-oxygen bonds in the third sub-segment 1413.

After the reaction is completed, the substrate may be rinsed 2 to 3 times with absolute ethyl alcohol, so as to remove unreacted first reactants.

The entire process can be completed in the air without using a glove box, the reaction conditions are mild, and the process is simple and easy.

It will be noted that, in order to increase the steric hindrance effect, the first reactant may further include a coordinating group M. Before the hydrolysis reaction between the first reactant and the hydroxyl group or the oxygen atom in the second portion L2 of each side wall L in the i-th opening group Ki, the method for manufacturing the light-emitting substrate further includes: protecting the coordinating group in the first reactant with a protecting group; and removing the protecting group after the grafting is completed. Alternatively, the method for manufacturing the light-emitting substrate further includes: reacting second reactants each having a coordinating group M with at least one siloxane segment 141 in each blocking unit 14, so as to form at least one coordinating group M in the blocking unit 14.

In the case where the first reactant further includes the coordinating group M, since the coordinating group M is usually a group with a lone pair of electrons, the coordinating group M has a stronger ability to attack than the hydroxyl group or the oxygen atom in the second portion L2 of the side wall L under hydrolysis reaction conditions. Therefore, in the embodiments, only by using the protecting group to protect the coordinating group M can the grafting reaction proceed smoothly.

In a case where the first reactant itself does not have a coordinating group M, the second reactant can be reacted with the siloxane segment 141, so as to introduce the coordinating group M into the blocking unit 14.

Therefore, in the embodiments, the method for manufacturing the light-emitting substrate further includes: reacting the second reactants each having the coordinating group M with the siloxane segment 141, so as to form the at least one coordinating group M in the blocking unit 14.

That is, after the siloxane segment 141 is grafted to the second portion L2 of the side wall L, the second reactants each having the coordinating group M are reacted with the siloxane segment 141.

In this case, correspondingly, the first reactant does not have a coordinating group, and includes any one or more of tetramethyl orthosilicate, tetraethyl orthosilicate, diphenyldimethoxysilane, hexadecyltrimethoxysilane, isobutyltriethoxysilane, isobutyltrimethoxysilane, dimethyldimethoxysilane, methyltris(methylethylketoximino)silane, methyltriacetoxysilane, 3-isocyanatopropyltriethoxysilane, phenyltrimethoxysilane, phenyltriethoxysilane, (octyl)-trimethoxysilane, n-octyltriethoxysilane, dodecyltriethoxysilane, dodecyltrimethoxysilane and vinyltris(methylethylketoximino)silane.

Figure 22:
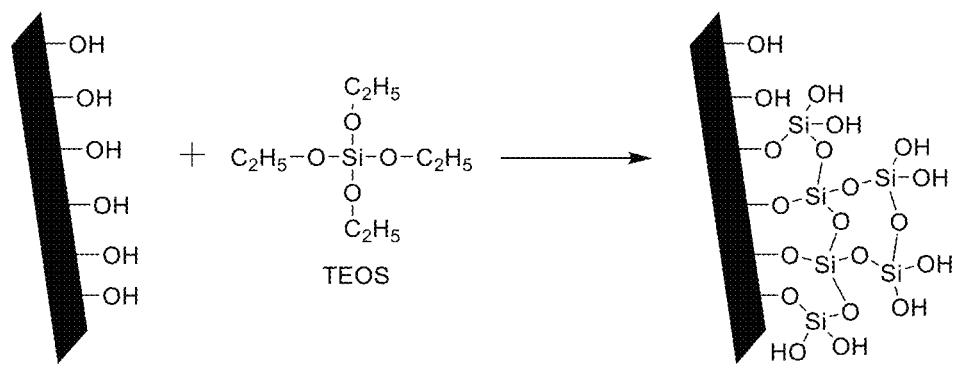
FIG. 22 is a structural diagram of an equation for a hydrolysis reaction between a first reactant and hydroxyl groups in a second portion of each side wall of an i-th opening group, in accordance with some embodiments.

For example, if the first reactant is tetraethyl orthosilicate (TEOS), the equation for the hydrolysis reaction between the first reactant and the hydroxyl group in the second portion L2 of each side wall L in the i-th opening group Ki is as shown in FIG. 22.

The second reactant having the coordinating group M may be any reactant that can react with the siloxane segment 141.

In specific operation, a suitable second reactant may be selected according to the functional groups in the siloxane segment 141, so that the second reactant chemically reacts with the siloxane segment 141, and the coordinating group M is introduced into the siloxane segment 141.

In some embodiments, the general structural formula of the second reactant is as shown in the following formula (2):

(2)

Where $R_1'$ is any one of an alkoxy group, an acyloxy group and a ketoxime group; $R_2'$ is any one of first hydrocarbyl groups of aliphatics, aromatics or a mixture of aliphatics and aromatics that are branched or unbranched and saturated or unsaturated, a first hydrocarbyl group has the coordinating group; $R_3'$ and $R_4'$ are each any one of a hydrogen atom, a hydroxyl group, an alkoxy group, an acyloxy group, a ketoxime group, and second hydrocarbyl groups of aliphatics, aromatics or a mixture of aliphatics and aromatics that are branched or unbranched and saturated or unsaturated, a second hydrocarbyl group has the coordinating group or has no coordinating group.

In these embodiments, the second reactant may undergo a hydrolysis reaction with the siloxane segment 141 under mild conditions, and the reaction is simple. The second reactant may also act as a capping reagent to end-cap the siloxane segment 141, so as to adjust the number of silicon-oxygen bonds in the siloxane segment 141. Moreover, it may also cause the coordinating group M to be formed at the end of the siloxane segment 141, which facilitates the coordination of the coordinating group M with the quantum dots in the quantum dot light-emitting pattern 1331.

In specific operation, a solution of the second reactant may be prepared first, then the solution of the second reactant is dropped onto the substrate on which the siloxane segment 141 has been formed, and the second reactant and the siloxane segment 141 are reacted by spin coating. Alternatively, the substrate 11 formed with the siloxane segment 141 is immersed in the solution of the second reactant, and allowed to stand at room temperature for 1 to 2 hours, so that the second reactant reacts with the siloxane segment 141, and the coordinating group M is introduced into the siloxane segment 141.

In yet some other embodiments, the second reactant includes any one or more of (3-Mercaptopropyl)trimethoxysilane, (3-Mercaptopropyl)triethoxysilane, (3-Mercaptopropyl)methyldimethoxysilane, (3-Mercaptopropyl)methyldiethoxysilane, Mercaptopropylsilane, 3-Mercaptopropyltrimethylsilane, Bis-[3-(triethoxysilyl) propyl]-tetrasulfide, (3-Aminopropyl)trimethoxysilane, (3-Aminopropyl)triethoxysilane, (3-Aminopropyl)methyldiethoxysilane, N-(β-aminoethyl-γ-aminopropyl)trimethoxysilane, N-(β-aminoethyl-γ-aminopropyl)methyldimethoxysilane, Diethylenetriaminopropyltrimethoxysilane, 3-Ureidopropyltrimethoxysilane, n-Butylaminopropyltrimethoxysilane, N-(2-aminoethyl)-3-aminopropyltrimethoxysilane, N-[3-(Trimethoxysilyl)propyl]ethylenediamine, 3-(Phenylamino)propyltrimethoxysilane, N-phenyl-3-aminopropyltrimethoxysilane, [3-(2-Aminoethyl) aminopropyl]trimethoxysilane, N-(n-Butyl)-3-aminopropyltrimethoxysilane, and N-(β-aminoethyl-γ-aminopropyl)trimethoxysilane.

Figure 23:
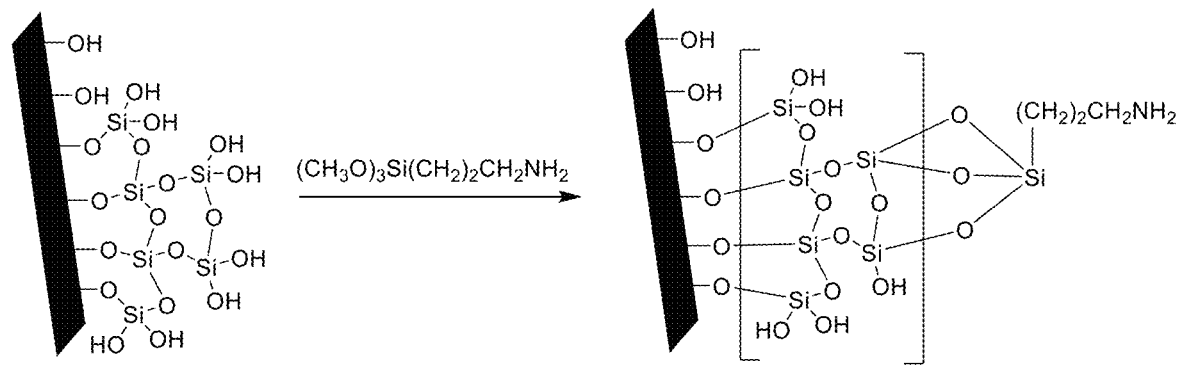
FIG. 23 is a structural diagram of an equation for an reaction between a second reactant and a siloxane segment, in accordance with some embodiments.

For example, if the second reactant is (3-Aminopropyl) trimethoxysilane, the equation for the reaction between the second reactant and the siloxane segment is as shown in FIG. 23.

In S25, the mask 01 is dissolved to remove the formed reserved pattern 1330 together.

For example, the mask 01 may include a photoresist sub-mask, and accordingly, a developer solution may be used to dissolve the mask 01. For example, in a case where the photoresist sub-mask is a positive photoresist, an alkaline developer solution is used to dissolve the mask 01; in a case where the photoresist sub-mask is a negative photoresist, a p-xylene developer solution is used to dissolve the mask 01. This is a case where the mask 01 includes only one layer.

For another example, the mask 01 may include a plurality of layers. As shown in FIG. 21, the mask 01 includes a first sub-mask 011 and a second sub-mask 012, and the first sub-mask 011 is closer to the substrate 11 than the second sub-mask 012. The first sub-mask 011 is a polymer sub-mask soluble in an alcohol solvent, and the second sub-mask 012 is a photoresist sub-mask. Correspondingly, the alcohol solvent may be used to dissolve the mask 01. In this case, by using the alcohol solvent to dissolve the polymer sub-mask and performing an ultrasonic treatment, the photoresist sub-mask on the polymer sub-mask and the reserved pattern 1330 may be removed together.

For example, considering an example where the light-emitting substrate 1 is a full-color display panel, in a case where n is 3, quantum dot light-emitting patterns emitting one color of light are formed by the manufacturing method described above, and quantum dot light-emitting patterns emitting the other two colors of light are formed by an existing process.

In some other embodiments, the method for manufacturing the light-emitting substrate further includes: repeating the above steps S22, S23, S24 and S25, so as to fabricate at least two quantum dot light-emitting patterns emitting different colors of light.

Based on this, in a case where the light-emitting substrate 1 is the full-color display panel, the first type of quantum dot light-emitting patterns 1331, the second type of quantum dot light-emitting patterns 1331 and the third type of quantum dot light-emitting patterns 1331 may be sequentially formed through three patterning processes.

Figure 24:
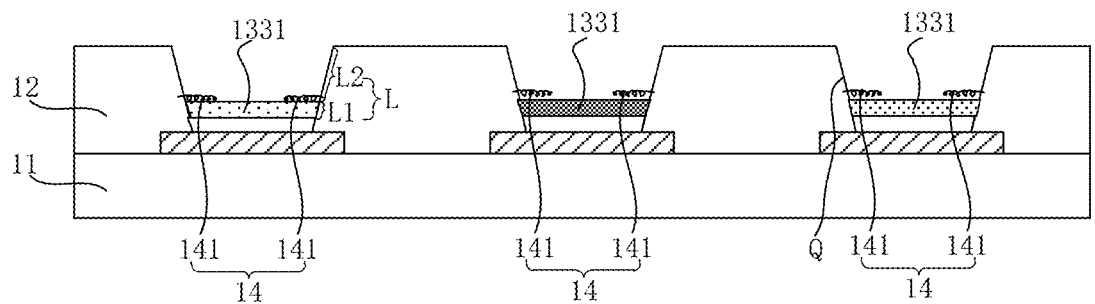
FIG. 24 is a sectional view of yet another light-emitting substrate, in accordance with some embodiments.

That is, as shown in FIG. 21, in a case where the i-th type of quantum dot light-emitting patterns have been fabricated by the method as described above, the steps S22, S23, S24, and S25 shown in FIG. 21 may be repeated two more times to form the other two types of quantum dot light-emitting patterns 1331 sequentially, so as to obtain the structure as shown in FIG. 24.

In the method for manufacturing the light-emitting substrate 1 provided in the embodiments of the present disclosure, the step of grafting at least one siloxane segment 141 to the second portion L2 of the side wall L of each opening Q in the i-th opening group Ki has been described above. Next, other steps of the method for manufacturing the light-emitting substrate provided in the embodiments of the present disclosure will be exemplarily described.

In the embodiments, the mask 01 may be formed by spin coating, exposure and photolithography processes.

Figure 25:
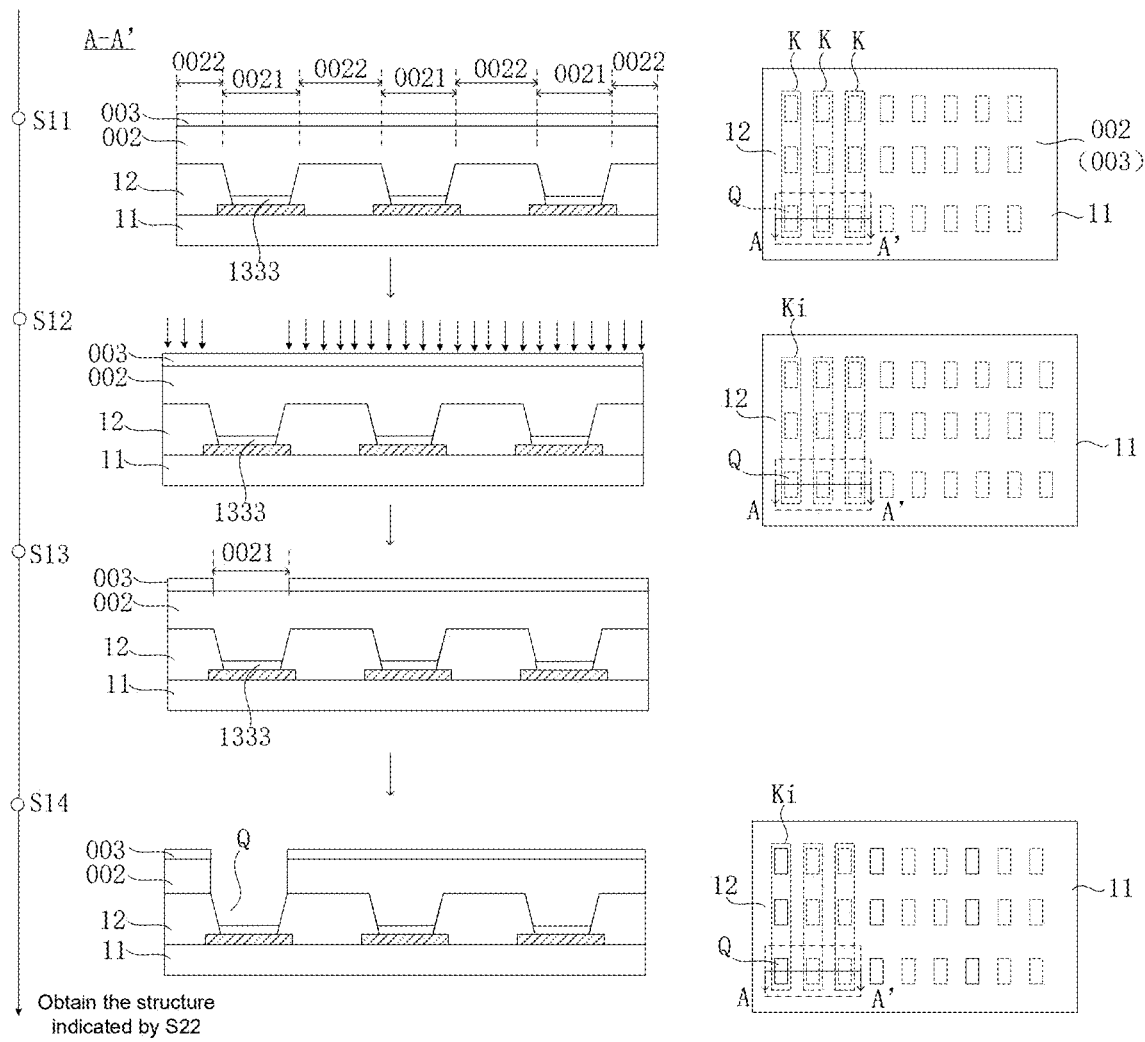
FIG. 25 is a flow diagram of yet another method for manufacturing a light-emitting substrate, in accordance with some embodiments.

In an example where the mask 01 includes the first sub-mask 011 and the second sub-mask 012, the first sub-mask 011 is closer to the substrate 11 than the second sub-mask 012, the first sub-mask 011 is the polymer sub-mask soluble in the alcohol solvent, and the second sub-mask 012 is the negative photoresist sub-mask, before forming the mask 01 on the substrate 11 on which the pixel defining layer 12 has been formed, the mask 01 exposing all openings in the i-th opening group and covering at least the remaining openings Q in the plurality of openings Q except for the i-th opening group Ki, as shown in FIG. 25, the method further includes the following steps.

In S11, a polymer layer 002 is formed on the pixel defining layer 12 by spin coating, and a negative photoresist layer 003 is formed on the polymer layer 002. The polymer layer 002 includes portions 0021 filled in the plurality of openings Q and a portion 0022 formed on the pixel defining layer 12, surfaces of the portions 0021 of the polymer layer 002 filled in the plurality of openings Q away from the substrate 11 are flush with a surface of the portion 0022 formed on the pixel definition layer 12 away from the substrate 11, and both the polymer layer 002 and the negative photoresist layer 003 are continuously distributed.

In S12, regions of the negative photoresist layer 003 covering openings, except for the openings Q in the i-th opening group Ki, in the plurality of openings Q are exposed.

In S13, portions of the negative photoresist 003 in regions where the openings Q in the i-th opening group Ki are located are removed by developing, so as to expose the polymer layer 002 in the regions where the openings Q in the i-th opening group Ki are located (i.e., portions 0021 filled in the openings Q in the i-th opening group Ki).

Next, in S14, a dry etching process is used to etch away portions of the polymer layer 002 located in regions where the openings Q in the i-th opening group Ki are located, so as to expose the openings Q in the i-th opening group Ki and obtain the structure indicated by S22 in FIG. 21.

On the basis of the above manufacturing method, considering an example where the light-emitting substrate is the display substrate 1 having "inverted" type light-emitting devices 13 as described, before forming the pixel defining layer 12, the method further includes: forming pixel driving circuits and first electrodes 131 located in the sub-pixel regions Q' on the substrate 11, and electrically connecting each pixel driving circuit to a respective first electrode 131.

The first electrode 131 is a cathode, and since the material of the first electrode 131 is Al, Ag, ITO or Mg—Al alloy, the first electrode 131 may be formed by sputtering or evaporation deposition.

In addition, after forming the pixel defining layer 12, the method further includes: forming an electron transport layer 1333 in each opening Q to obtain the structure indicated by S1 in FIG. 21. The electron transport layer 1333 may be formed by a spin coating process. By adjusting the rotational speed of the spin coating and the concentration of the solution of the material of the electron transport layer 1333, it may be possible to control the thickness of the electron transport layer 1333 to be in a range of 20 nm to 100 nm, inclusive.

The material of the electron transport layer 1333 may be any one of magnesium zinc oxide, gallium zinc oxide and magnesium aluminum zinc oxide.

In addition, after grafting the at least one siloxane segment 141 to the second portion L2 of each side wall L in the i-th opening group Ki and dissolving the mask 01 to remove the formed reserved pattern 1330 together, the method for manufacturing the light-emitting substrate further includes a follow step.

Figure 26:
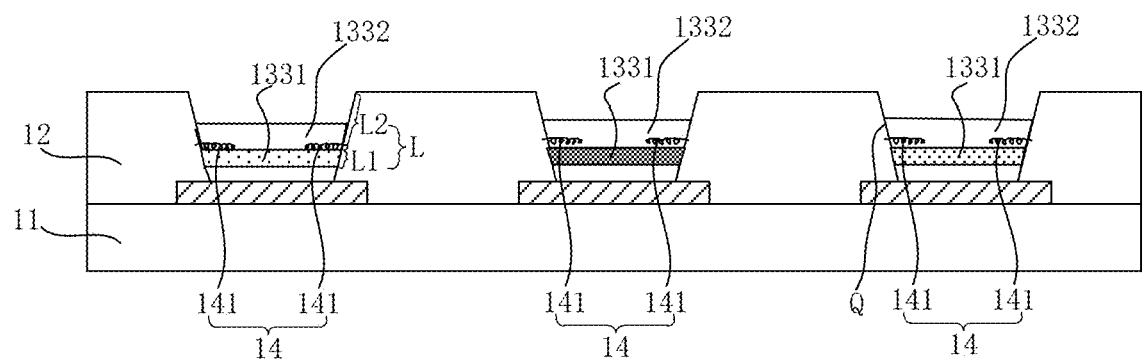
FIG. 26 is a sectional view of yet another light-emitting substrate, in accordance with some embodiments.

In S3, a hole transport layer 1332 is formed in each opening Q to obtain the structure shown in FIG. 26. The material of the hole transport layer 1332 may be a polymer material. For example, the material of the hole transport layer 1332 includes any one or more of TFB (Poly(9,9-dioctylfluorene-co-N-(4-butylphenyl)diphenylamine), also referred to as Poly(9,9-dioctylfluorene-co-N)-(4-butylphenyl)diphenylamine), NPB (N,N'-Bis(naphthalen-1-yl)-N,N'-bis(phenyl)benzidine, also referred to as N,N'-Bis-(1-naphthalenyl)-N,N'-bis-phenyl-(1,1'-biphenyl)-4,4'-diamine), 2,4,6-Tris[3-(diphenylphosphinyl)phenyl]-1,3,5-triazine, 4,4',4"-Tris[N-(naphthalen-2-yl)-N-phenylamino]triphenylamine, Tris(2,4,6-trimethyl-3-(pyridin-3-yl)phenyl)borane, and 4,6-Bis(3,5-di-3-pyridylphenyl)-2-methylpyrimidine.

After spin coating, a film may be formed by heating. For example, the heating temperature of TFB may be 130° C. to 150° C., and the film may be formed by heating in an inert gas. The thickness of the film may be adjusted by controlling the rotation speed of the spin coating. In addition, NPB may be prepared by vacuum evaporation deposition.

Figure 27:
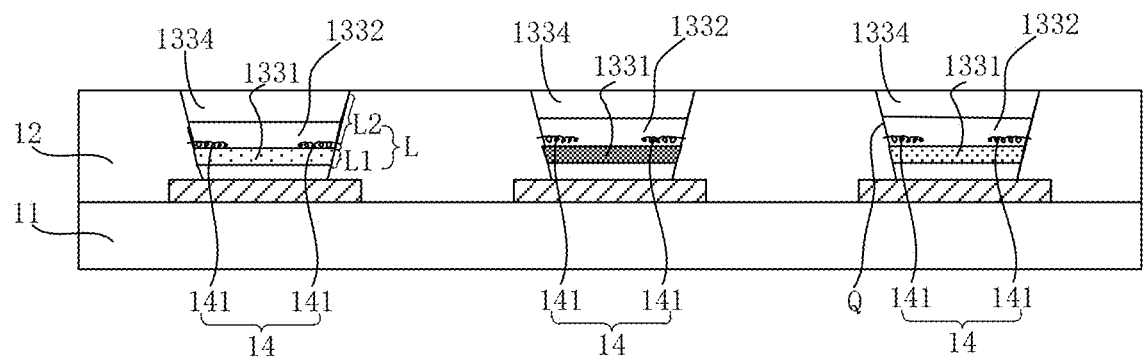
FIG. 27 is a sectional view of yet another light-emitting substrate, in accordance with some embodiments.

After forming the hole transport layer 1332, the method further includes: S4, forming a hole injection layer 1334, so as to obtain the structure shown in FIG. 27. The material of the hole injection layer 1334 may include any one or more of 1,3-Bis[3,5-di(pyridin-3-yl)phenyl]benzene, 4,7-diphenyl-1,10-phenanthroline, 2,3,6,7,10,11-Hexacyano-1,4,5,8,9,12-hexaazatriphenylene, 4,4',4"-Tris[phenyl(m-tolyl)amino]triphenylamine, and PEDOT (Poly(3,4-ethylenedioxythiophene)).

The hole injection layer 1334 may also be formed by spin coating or evaporation deposition. For example, the PEDOT layer may be obtained by forming a film at a temperature of 130° C. to 150° C. in air.

Figure 28:
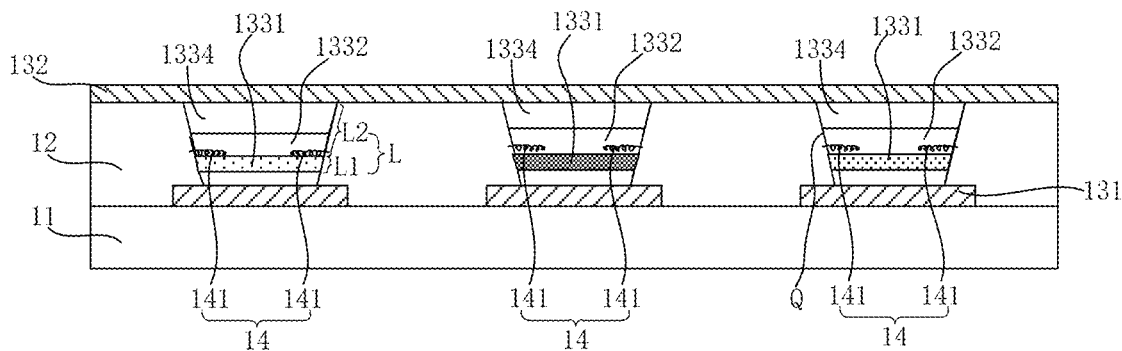
FIG. 28 is a sectional view of yet another light-emitting substrate, in accordance with some embodiments.

Furthermore, the method for manufacturing the light-emitting substrate further includes: S5, forming a second electrode 132 to obtain the structure shown in FIG. 28. The second electrode 132 is an anode, and the material of the anode may be selected from aluminum, silver, gold or indium zinc oxide (IZO). The aluminum, silver, or gold electrode may be formed by evaporation deposition, and the IZO electrode may be formed by sputtering.

Figure 29:
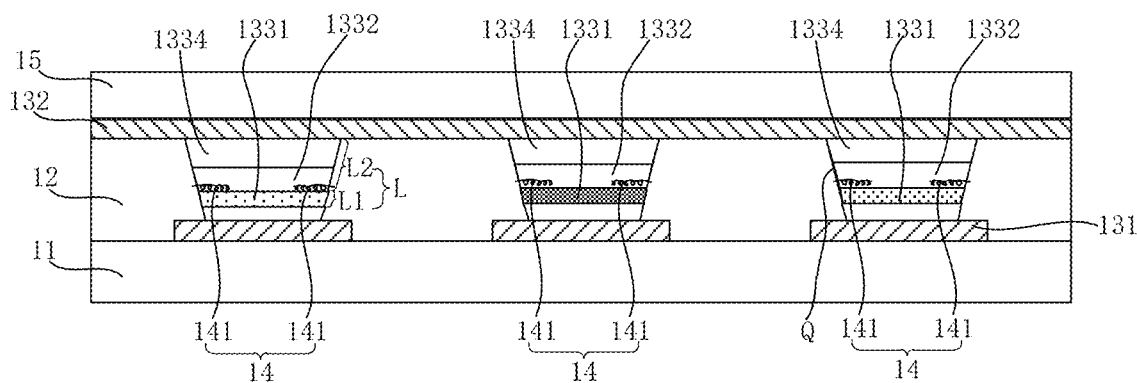
FIG. 29 is a sectional view of yet another light-emitting substrate, in accordance with some embodiments.

Furthermore, the method for manufacturing the light-emitting substrate further includes: S6, forming an encapsulation layer 15 to obtain the structure shown in FIG. 29. The material of the encapsulation layer 15 may be an ultraviolet curing adhesive. Under the excitation of ultraviolet light, the ultraviolet curing adhesive is cured to encapsulate the light-emitting devices.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure.

Therefore, the protection scope of the present disclosure shall be subject to the protection scope of the claims.

What is claimed is:

1. A light-emitting substrate, comprising:
   a substrate;
   a pixel defining layer disposed on the substrate, the pixel defining layer having a plurality of openings;
   a plurality of light-emitting devices, each light-emitting device including a quantum dot light-emitting pattern disposed in an opening; and
   at least one blocking unit, each blocking unit including at least one siloxane segment, wherein
   each opening has at least one side wall, and a side wall includes a first portion and a second portion; the first portion is a portion of the side wall that is in contact with a respective quantum dot light-emitting pattern, and the second portion is a portion of the side wall that is away from the substrate relative to the first portion;
   each blocking unit is located in an opening, and the at least one siloxane segment in each blocking unit is grafted to a second portion of a corresponding side wall.

2. The light-emitting substrate according to claim 1, wherein
   the at least one siloxane segment in each blocking unit is bonded to an oxygen atom in the second portion of the corresponding side wall.

3. The light-emitting substrate according to claim 2, wherein
   each siloxane segment includes at least one silicon-oxygen bond; each siloxane segment includes a first sub-segment bonded to the oxygen atom in the second portion of the corresponding side wall, and at least one second sub-segment; each second sub-segment is bonded to a silicon atom in the first sub-segment; a number of silicon-oxygen bonds in the first sub-segment is in a range from 1 to 25, inclusive, and a total number of silicon-oxygen bonds in a second sub-segment bonded to a same silicon atom in the first sub-segment is in a range from 0 to 24, inclusive.

4. The light-emitting substrate according to claim 3, wherein
   each blocking unit includes at least two siloxane segments; the at least two siloxane segments are cross-linked with each other to form at least one third sub-segment, and a number of silicon-oxygen bonds in each third sub-segment is in a range from 2 to 25, inclusive.

5. The light-emitting substrate according to claim 1, wherein
   a material of the pixel defining layer includes a hydroxyl-containing polymer material or a silicon-containing inorganic oxide material; or
   a material of the pixel defining layer includes a hydroxyl-containing polymer material or a silicon-containing inorganic oxide material, and the hydroxyl-containing polymer material includes one or more of polyethylene glycol, polyvinyl acetate, cellulose and chitosan.

6. The light-emitting substrate according to claim 1, wherein
   each blocking unit further includes at least one coordinating group each grafted to one or more siloxane segments, and each coordinating group is bonded to at least one quantum dot in a corresponding quantum dot light-emitting pattern; or
   each blocking unit further includes at least one coordinating group each grafted to one or more siloxane segments, and each coordinating group is bonded to at least one quantum dot in a corresponding quantum dot light-emitting pattern; each coordinating group includes one of a sulfur-containing group, a nitrogen-containing group, and an oxygen-containing group.

7. The light-emitting substrate according to claim 6, wherein
   the at least one siloxane segment in each blocking unit further includes a capping group, and a coordinating group is formed on the capping group; or
   the at least one siloxane segment in each blocking unit further includes a capping group, and a coordinating group is formed on the capping group; the capping group is a silane group.

8. The light-emitting substrate according to claim 6, wherein
   coordination atoms of the at least one coordinating group in each blocking unit account for 3.5% to 12.7% of the blocking unit by mass.

9. The light-emitting substrate according to claim 1, wherein
   the plurality of light-emitting devices include a plurality of types of light-emitting devices emitting different colors of light, and second portions of side walls corresponding to each kind of light-emitting devices are each grafted with the at least one siloxane segment.

10. The light-emitting substrate according to claim 1, wherein
    each light-emitting device further includes:
    a first electrode located on a side of the quantum dot light-emitting pattern facing the substrate and configured to provide one of electrons and holes for the quantum dot light-emitting pattern; and a second electrode located on a side of the quantum dot light-emitting pattern facing away from the substrate and configured to provide another of the electrons and the holes for the quantum dot light-emitting pattern; or
    each light-emitting device further includes:
    a first electrode located on a side of the quantum dot light-emitting pattern facing the substrate and configured to provide one of electrons and holes for the quantum dot light-emitting pattern; a second electrode located on a side of the quantum dot light-emitting pattern facing away from the substrate and configured to provide another of the electrons and the holes for the quantum dot light-emitting pattern; and an electron transport layer disposed between the quantum dot light-emitting pattern and an electrode, for providing the electrons, of the first electrode and the second electrode, a material of the electron transport layer being an inorganic material.

11. A light-emitting apparatus, comprising the light-emitting substrate according to claim 1.

12. A method for manufacturing a light-emitting substrate, comprising:
    forming a pixel defining layer on a substrate, the pixel defining layer having a plurality of openings; and
    forming a plurality of light-emitting devices and at least one blocking unit on the substrate, each light-emitting device including a quantum dot light-emitting pattern formed in an opening, each blocking unit including at least one siloxane segment, wherein
    each opening has at least one side wall, and a side wall includes a first portion and a second portion; the first portion is a portion of the side wall that is in contact with a respective quantum dot light-emitting pattern, and the second portion is a portion of the side wall that is away from the substrate relative to the first portion; each blocking unit is located in an opening, and the at least one siloxane segment in each blocking unit is grafted to a second portion of a corresponding side wall.

13. The method for manufacturing the light-emitting substrate according to claim 12, wherein
forming the plurality of light-emitting devices and the at least one blocking unit on the substrate includes:
dividing the plurality of openings into n opening groups, each opening group including at least one opening, and n being a positive integer greater than or equal to 2;
forming a mask on the substrate on which the pixel defining layer has been formed, the mask exposing all openings in an i-th opening group and covering at least remaining openings in the plurality of openings except for the i-th opening group, and i being a value in a range from 1 to n, inclusive;
forming a quantum dot light-emitting layer on the substrate on which the mask has been formed, the quantum dot light-emitting layer including the quantum dot light-emitting pattern located in each opening of the i-th opening group and a reserved pattern covering the mask;
grafting the at least one siloxane segment to the second portion of each side wall in the i-th opening group, each siloxane segment of the at least one siloxane segment including at least one silicon-oxygen bond; and
dissolving the mask to remove the formed reserved pattern together.

14. The method for manufacturing the light-emitting substrate according to claim 13, wherein
the mask includes a photoresist sub-mask; and dissolving the mask includes: using a developer solution to dissolve the mask; or
the mask includes a first sub-mask and a second sub-mask that are stacked, and the first sub-mask is closer to the substrate than the second sub-mask; the first sub-mask is a polymer sub-mask soluble in an alcohol solvent, and the second sub-mask is a photoresist sub-mask; and dissolving the mask includes: using the alcohol solvent to dissolve the mask.

15. The method for manufacturing the light-emitting substrate according to claim 13, wherein
a material of the pixel defining layer includes a hydroxyl-containing polymer material or a silicon-containing inorganic oxide material; and
grafting the at least one siloxane segment to the second portion of each side wall in the i-th opening group includes:
in a case where the material of the pixel defining layer includes the hydroxyl-containing polymer material, hydrolyzing first reactants with hydroxyl groups in the second portion of each side wall in the i-th opening group;
in a case where the material of the pixel defining layer includes the silicon-containing inorganic oxide material, hydrolyzing first reactants with oxygen atoms in the second portion of each side wall in the i-th opening group, wherein
a general structural formula of a first reactant is shown in a following formula (1):

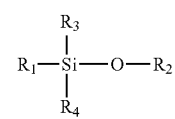

wherein $R_1$ is any one of an alkoxy group, an acyloxy group, and a ketoxime group;
$R_2$ is any one of a hydrogen atom, an alkyl group, an alkenyl group, and an aryl group; and
$R_3$ and $R_4$ are each any one of a hydrogen atom, an alkoxy group, a hydroxy group, an acyloxy group, a ketoxime group, an alkyl group, an alkenyl group, and an aryl group.

16. The method for manufacturing the light-emitting substrate according to claim 15, wherein
hydrolyzing the first reactants with the hydroxyl groups or the oxygen atoms in the second portion of each side wall in the i-th opening group, includes:
bringing the first reactants into contact with the second portion of each side wall in the i-th opening group in a pH range of 8 to 11, so that the first reactants and the hydroxyl groups or the oxygen atoms in the second portion of each side wall in the i-th opening group undergo a hydrolysis reaction.

17. The method for manufacturing the light-emitting substrate according to claim 15, wherein
the first reactant further includes a coordinating group; and
before the hydrolysis reaction between the first reactants and the hydroxyl groups or oxygen atoms in the second portion of each side wall in the i-th opening group, the method further comprises:
protecting the coordinating group with a protecting group; and
removing the protecting group after the grafting is completed.

18. The method for manufacturing the light-emitting substrate according to claim 15, further comprising:
reacting second reactants each having a coordinating group with the at least one siloxane segment in each blocking unit, so as to form at least one coordinating group in the blocking unit.

19. The method for manufacturing the light-emitting substrate according to claim 18, wherein
a general structural formula of a second reactant is shown in a following formula (2):

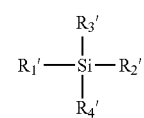

wherein $R_1'$ is any one of an alkoxy group, an acyloxy group and a ketoxime group;
$R_2'$ is any one of first hydrocarbyl groups of aliphatics, aromatics or a mixture of aliphatics and aromatics that are branched or unbranched and saturated or unsaturated, a first hydrocarbyl group has the coordinating group; and
$R_3'$ and $R_4'$ are each any one of a hydrogen atom, a hydroxyl group, an alkoxy group, an acyloxy group, a ketoxime group, and second hydrocarbyl groups of aliphatics, aromatics or a mixture of aliphatics and aromatics that are branched or unbranched and saturated or unsaturated, a second hydrocarbyl group has the coordinating group or has no coordinating group.

20. The method for manufacturing the light-emitting substrate according to claim 19, wherein the first reactant includes any one or more of tetramethyl orthosilicate, tetraethyl orthosilicate, diphenyldimethoxysilane, hexadecyltrimethoxysilane, isobutyltriethoxysilane, isobutyltrimethoxysilane, dimethyldimethoxysilane, methyltris(methylethylketoximino)silane, methyltriacetoxysilane, 3-isocyanatopropyltriethoxysilane, phenyltrimethoxysilane, phenyltriethoxysilane, (octyl)-trimethoxysilane, n-octyltriethoxysilane, dodecyltriethoxysilane, dodecyltrimethoxysilane and vinyltris(methylethylketoximino)silane;

the second reactant includes any one or more of (3-Mercaptopropyl)trimethoxysilane, (3-Mercaptopropyl)triethoxysilane, (3-Mercaptopropyl)methyldimethoxysilane, (3-Mercaptopropyl)methyldiethoxysilane, Mercaptopropylsilane, 3-Mercaptopropyltrimethylsilane, Bis-[3-(triethoxysilyl)propyl]-tetrasulfide, (3-Aminopropyl)trimethoxysilane, (3-Aminopropyl) triethoxysilane, (3-Aminopropyl)methyldiethoxysilane, N-(β-aminoethyl-γ-aminopropyl)trimethoxysilane, N-(β-aminoethyl-γ-aminopropyl) methyldimethoxysilane, Diethylenetriaminopropyltrimethoxysilane, 3-Ureidopropyltrimethoxysilane, n-Butylaminopropyltrimethoxysilane, N-(2-aminoethyl)-3-aminopropyltrimethoxysilane, N-[3-(Trimethoxysilyl)propyl] ethylenediamine, 3-(Phenylamino) propyltrimethoxysilane, N-phenyl-3-aminopropyltrimethoxysilane, [3-(2-Aminoethyl) aminopropyl]trimethoxysilane, N-(n-Butyl)-3-aminopropyltrimethoxysilane, and N-(β-aminoethyl-γ-aminopropyl)trimethoxysilane.

* * * * *